(12) United States Patent
Nei et al.

(10) Patent No.: US 7,834,976 B2
(45) Date of Patent: Nov. 16, 2010

(54) EXPOSURE APPARATUS AND METHOD FOR PRODUCING DEVICE

(75) Inventors: Masahiro Nei, Yokohama (JP); Naoyuki Kobayashi, Fukaya (JP)

(73) Assignee: Nikon Corporation, Tokyo (JP)

( * ) Notice: Subject to any disclaimer, the term of this patent is extended or adjusted under 35 U.S.C. 154(b) by 421 days.

(21) Appl. No.: 11/482,153

(22) Filed: Jul. 7, 2006

(65) Prior Publication Data

US 2006/0250596 A1 Nov. 9, 2006

Related U.S. Application Data

(60) Division of application No. 11/141,518, filed on Jun. 1, 2005, now Pat. No. 7,242,455, which is a continuation of application No. PCT/JP03/15667, filed on Dec. 8, 2003.

(30) Foreign Application Priority Data

Dec. 10, 2002 (JP) ............................. 2002-357962

(51) Int. Cl.
G03B 27/42 (2006.01)
G03B 27/52 (2006.01)
G03B 27/58 (2006.01)
(52) U.S. Cl. ............................. 355/53; 355/55; 355/72
(58) Field of Classification Search .................. 355/30, 355/52, 53, 55, 67–71; 250/548
See application file for complete search history.

(56) References Cited

U.S. PATENT DOCUMENTS

| | | | |
|---|---|---|---|
| 3,573,975 A | 4/1971 | Dhaka et al. | |
| 3,648,587 A | 3/1972 | Stevens | |
| 4,346,164 A | 8/1982 | Tabarelli et al. | |
| 4,390,273 A | 6/1983 | Loebach et al. | |
| 4,396,705 A | 8/1983 | Akeyama et al. | |
| 4,480,910 A * | 11/1984 | Takanashi et al. | ............. 355/30 |
| 4,509,852 A | 4/1985 | Tabarelli et al. | |
| 5,040,020 A | 8/1991 | Rauschenbach et al. | |
| 5,121,256 A | 6/1992 | Corle et al. | |

(Continued)

FOREIGN PATENT DOCUMENTS

DE 206 607 2/1984

(Continued)

OTHER PUBLICATIONS

S. Owa and N. Nagasaka, "Potential Performance and Feasibility of Immersion Lithography," NGL Workshop 2003, Jul. 10, 2003, Slide Nos. 1-33.

(Continued)

*Primary Examiner*—Hung Henry Nguyen
(74) *Attorney, Agent, or Firm*—Oliff & Berridge, PLC

(57) ABSTRACT

An exposure apparatus includes a projection optical system for projecting a pattern on a reticle onto an object to be exposed. The apparatus also includes a reference mark that serves as a reference for an alignment between the reticle and the object. The apparatus also includes a first fluid that has a refractive index of 1 or greater, and fills a space between at least part of said projection optical system and the object and a space between at least part of said projection optical system and the reference mark. In addition, an alignment mechanism aligns the object by using said projection optical system and the first fluid.

13 Claims, 8 Drawing Sheets

U.S. PATENT DOCUMENTS

| | | | |
|---|---|---|---|
| 5,493,403 A | 2/1996 | Nishi | |
| 5,610,683 A | 3/1997 | Takahashi | |
| 5,646,413 A | 7/1997 | Nishi | |
| 5,654,553 A * | 8/1997 | Kawakubo et al. | 250/548 |
| 5,715,039 A | 2/1998 | Fukuda et al. | |
| 5,715,064 A | 2/1998 | Lin | |
| 5,825,043 A | 10/1998 | Suwa | |
| 5,900,354 A | 5/1999 | Batchelder | |
| 5,969,441 A | 10/1999 | Loopstra et al. | |
| 6,097,473 A * | 8/2000 | Ota et al. | 355/53 |
| 6,191,429 B1 | 2/2001 | Suwa | |
| 6,195,154 B1 | 2/2001 | Imai | |
| 6,198,527 B1 | 3/2001 | Nishi | |
| 6,208,407 B1 | 3/2001 | Loopstra | |
| 6,236,634 B1 | 5/2001 | Lee et al. | |
| 6,281,966 B1 | 8/2001 | Kenmoku | |
| 6,341,007 B1 | 1/2002 | Nishi et al. | |
| 6,400,441 B1 | 6/2002 | Nishi et al. | |
| 6,549,269 B1 | 4/2003 | Nishi et al. | |
| 6,560,032 B2 | 5/2003 | Hatano | |
| 6,590,634 B1 | 7/2003 | Nishi et al. | |
| 6,600,547 B2 | 7/2003 | Watson et al. | |
| 6,603,130 B1 | 8/2003 | Bisschops et al. | |
| 6,633,365 B2 | 10/2003 | Suenaga | |
| 7,242,455 B2 | 7/2007 | Nei et al. | |
| 2001/0023918 A1 | 9/2001 | Kondo | |
| 2002/0020821 A1 | 2/2002 | Van Santen et al. | |
| 2002/0042664 A1 | 4/2002 | Kikuchi | |
| 2002/0163629 A1 | 11/2002 | Switkes et al. | |
| 2003/0030916 A1 | 2/2003 | Suenaga | |
| 2003/0123040 A1 | 7/2003 | Almogy | |
| 2003/0174408 A1 | 9/2003 | Rostalski et al. | |
| 2004/0000627 A1 | 1/2004 | Schuster | |
| 2004/0021844 A1 | 2/2004 | Suenaga | |
| 2004/0075895 A1 | 4/2004 | Lin | |
| 2004/0109237 A1 | 6/2004 | Epple et al. | |
| 2004/0114117 A1 | 6/2004 | Bleeker | |
| 2004/0118184 A1 | 6/2004 | Violette | |
| 2004/0119954 A1 | 6/2004 | Kawashima et al. | |
| 2004/0125351 A1 | 7/2004 | Krautschik et al. | |
| 2004/0135099 A1 | 7/2004 | Simon et al. | |
| 2004/0136494 A1 | 7/2004 | Lof et al. | |
| 2004/0160582 A1 | 8/2004 | Lof et al. | |
| 2004/0165159 A1 | 8/2004 | Lof et al. | |
| 2004/0169834 A1 | 9/2004 | Richter et al. | |
| 2004/0169924 A1 | 9/2004 | Flagello et al. | |
| 2004/0180294 A1 | 9/2004 | Baba-Ali et al. | |
| 2004/0180299 A1 | 9/2004 | Rolland et al. | |
| 2004/0207824 A1 | 10/2004 | Lof et al. | |
| 2004/0211920 A1 | 10/2004 | Derksen et al. | |
| 2004/0224265 A1 | 11/2004 | Endo et al. | |
| 2004/0224525 A1 | 11/2004 | Endo et al. | |
| 2004/0227923 A1 | 11/2004 | Flagello et al. | |
| 2004/0253547 A1 | 12/2004 | Endo et al. | |
| 2004/0253548 A1 | 12/2004 | Endo et al. | |
| 2004/0257544 A1 | 12/2004 | Vogel et al. | |
| 2004/0259008 A1 | 12/2004 | Endo et al. | |
| 2004/0259040 A1 | 12/2004 | Endo et al. | |
| 2004/0263808 A1 | 12/2004 | Sewell | |
| 2005/0030506 A1 | 2/2005 | Schuster | |
| 2005/0036121 A1 | 2/2005 | Hoogendam et al. | |
| 2005/0036183 A1 | 2/2005 | Yeo et al. | |
| 2005/0036184 A1 | 2/2005 | Yeo et al. | |
| 2005/0036213 A1 | 2/2005 | Mann et al. | |
| 2005/0037269 A1 | 2/2005 | Levinson | |
| 2005/0046934 A1 | 3/2005 | Ho et al. | |
| 2005/0048223 A1 | 3/2005 | Pawloski et al. | |
| 2005/0052632 A1 | 3/2005 | Miyajima | |
| 2005/0068639 A1 | 3/2005 | Pierrat et al. | |
| 2005/0073670 A1 | 4/2005 | Carroll | |
| 2005/0084794 A1 | 4/2005 | Meagley et al. | |
| 2005/0094116 A1 | 5/2005 | Flagello et al. | |
| 2005/0100745 A1 | 5/2005 | Lin et al. | |
| 2005/0110973 A1 | 5/2005 | Streefkerk et al. | |
| 2005/0117224 A1 | 6/2005 | Shafer et al. | |
| 2005/0122497 A1 | 6/2005 | Lyons et al. | |
| 2005/0132914 A1 | 6/2005 | Mulkens et al. | |
| 2005/0134815 A1 | 6/2005 | Van Santen et al. | |
| 2005/0141098 A1 | 6/2005 | Schuster | |
| 2005/0146693 A1 | 7/2005 | Ohsaki | |
| 2005/0190455 A1 | 9/2005 | Rostalski et al. | |
| 2005/0217135 A1 | 10/2005 | O'Donnell et al. | |
| 2005/0217137 A1 | 10/2005 | Smith et al. | |
| 2005/0217703 A1 | 10/2005 | O'Donnell | |

FOREIGN PATENT DOCUMENTS

| | | |
|---|---|---|
| DE | 221 563 A1 | 4/1985 |
| DE | 224 448 A1 | 7/1985 |
| DE | 2 428 80 | 2/1987 |
| EP | 0 023 231 | 2/1981 |
| EP | 0 418 427 | 3/1991 |
| EP | 0 687 957 A1 | 12/1995 |
| EP | 0 834 773 A2 | 4/1998 |
| EP | 1 039 511 | 9/2000 |
| FR | 2 474 708 | 7/1981 |
| JP | A-57-153433 | 9/1982 |
| JP | A-58-202448 | 11/1983 |
| JP | A-59-19912 | 2/1984 |
| JP | A 62-65326 | 3/1987 |
| JP | 62-121417 | 6/1987 |
| JP | A 63-157419 | 6/1988 |
| JP | A 4-65603 | 3/1992 |
| JP | A-4-305915 | 10/1992 |
| JP | A-4-305917 | 10/1992 |
| JP | A-5-62877 | 3/1993 |
| JP | A-6-97031 | 4/1994 |
| JP | A 6-124873 | 5/1994 |
| JP | A 6-168866 | 6/1994 |
| JP | 07-132262 | 5/1995 |
| JP | A 7-176468 | 7/1995 |
| JP | A 7-220990 | 8/1995 |
| JP | A 8-37149 | 2/1996 |
| JP | A-8-316125 | 11/1996 |
| JP | A 10-154659 | 6/1998 |
| JP | A 10-163099 | 6/1998 |
| JP | 10-228661 | 8/1998 |
| JP | A 10-214783 | 8/1998 |
| JP | 10-255319 | 9/1998 |
| JP | A 10-303114 | 11/1998 |
| JP | A 10-340846 | 12/1998 |
| JP | A-11-176727 | 2/1999 |
| JP | A 11-176727 | 7/1999 |
| JP | A 2000-58436 | 2/2000 |
| JP | A 2000-505958 | 5/2000 |
| JP | 2001-091849 | 4/2001 |
| JP | A-2001-513267 | 8/2001 |
| JP | A 2001-257157 | 9/2001 |
| JP | A 2002-353121 | 12/2002 |
| JP | 2004-193252 | 7/2004 |
| WO | WO 99/32940 | 7/1999 |
| WO | WO 99/49504 | 9/1999 |
| WO | WO99/49504 | 9/1999 |
| WO | WO 02/08835 A2 | 1/2002 |
| WO | WO 02/091078 A1 | 11/2002 |
| WO | WO 03/077036 | 9/2003 |
| WO | WO 03/077037 | 9/2003 |
| WO | WO 2004/019128 A2 | 3/2004 |
| WO | WO 2004/053596 A2 | 6/2004 |
| WO | WO 2004/053950 A1 | 6/2004 |
| WO | WO 2004/053951 A1 | 6/2004 |
| WO | WO 2004/053952 A1 | 6/2004 |
| WO | WO 2004/053953 A1 | 6/2004 |
| WO | WO 2004/053955 A1 | 6/2004 |

| | | |
|---|---|---|
| WO | WO 2004/053956 A1 | 6/2004 |
| WO | WO 2004/053957 A1 | 6/2004 |
| WO | WO 2004/053958 A1 | 6/2004 |
| WO | WO 2004/053959 A1 | 6/2004 |
| WO | WO 2004/055803 A1 | 7/2004 |
| WO | WO 2004/057589 A1 | 7/2004 |
| WO | WO 2004/057590 A1 | 7/2004 |
| WO | WO 2004/077154 A2 | 9/2004 |
| WO | WO 2004/081666 A1 | 9/2004 |
| WO | WO 2004/090577 A2 | 10/2004 |
| WO | WO 2004/090633 A2 | 10/2004 |
| WO | WO 2004/090634 A2 | 10/2004 |
| WO | WO 2004/092830 A2 | 10/2004 |
| WO | WO 2004/092833 A2 | 10/2004 |
| WO | WO 2004/093130 A2 | 10/2004 |
| WO | WO 2004/093159 A2 | 10/2004 |
| WO | WO 2004/093160 A2 | 10/2004 |
| WO | WO 2004/095135 A2 | 11/2004 |
| WO | WO 2005/001432 A2 | 1/2005 |
| WO | WO 2005/003864 A2 | 1/2005 |
| WO | WO 2005/006026 A2 | 1/2005 |
| WO | WO 2005/008339 A2 | 1/2005 |
| WO | WO 2005/013008 A2 | 2/2005 |
| WO | WO 2005/015283 A1 | 2/2005 |
| WO | WO 2005/017625 A2 | 2/2005 |
| WO | WO 2005/019935 A2 | 3/2005 |
| WO | WO 2005/022266 A2 | 3/2005 |
| WO | WO 2005/024325 A2 | 3/2005 |
| WO | WO 2005/024517 A2 | 3/2005 |
| WO | WO 2005/034174 A2 | 4/2005 |
| WO | WO 2005/054953 A2 | 6/2005 |
| WO | WO 2005/054955 A2 | 6/2005 |
| WO | WO 2005/062128 A2 | 7/2005 |

OTHER PUBLICATIONS

M. Switkes et al., "Immersion Lithography at 157 nm", J. Vac. Sci. Technol. B., vol. 19, No. 6, Nov./Dec. 2001, pp. 2353-2356.

M. Switkes et al., "Immersion Lithography: Optics for the 50 nm Node", 157 Anvers-1, Sep. 4, 2002.

B.J. Lin, "The Paths to Subhalf-Micrometer Optical Lithography", SPIE vol. 922, Optical/Laser Microlithography (1988), pp. 256-269.

G.W.W. Stevens, "Reduction of Waste Resulting from Mask Defects", Solid State Technology, Aug. 1978, vol. 21 008, pp. 68-72.

S. Owa et al., "Immersion Lithography" Its potential performance and issues, SPIE Microlithography 2003, 5040-186, Feb. 27, 2003.

S. Owa et al., "Advantage and Feasibility of Immersion Lithography", J. Microlith., Microfab., Microsyst., vol. 3, No. 1, Jan. 2004.

H. Kawata et al., "Optical Projection Lithography using Lenses with Numerical Apertures Greater than Unity", Microelectronic Engineering 9 (1989), pp. 31-36.

J.A. Hoffnagle et al., "Liquid Immersion Deep-Ultraviolet Interferometric Lithography", J. Vac. Sci. Technol. B., vol. 17, No. 6, Nov./Dec. 1999, pp. 3306-3309.

B.W. Smith et al., "Immersion Optical Lithography at 193nm", Future Fab International, vol. 15, Jul. 11, 2003.

H. Kawata et al., "Fabrication of 0.2 μm Fine Patterns Using Optical Projection Lithography with an Oil Immersion Lens", Jpn. J. Appl. Phys. vol. 31 (1992), pp. 4174-4177.

G. Owen et al., "1/8 μm Optical Lithography", J. Vac. Sci. Technol. B., vol. 10, No. 6, Nov./Dec. 1992, pp. 3032-3036.

H. Hogan, "New Semiconductor Lithography Makes a Splash", Photonics Spectra, Photonics Technology/World, Oct. 2003 Edition, pp. 1-3.

B.J. Lin, "Drivers, Prospects and Challenges for Immersion Lithography", TSMC, Inc. Sep. 2002.

B.J. Lin, "Proximity Printing Through Liquid", IBM Technical Disclosure Bulletin, vol. 20, No. 11B, Apr. 1978, p. 4997.

S. Owa et al., "Update on 193nm immersion exposure tool", Litho Forum International Sematech, Los Angeles, Jan. 27-29, 2004, Slide Nos. 1-51.

H. Hata, "The Development of Immersion Exposure Tools", Litho Forum International Sematech, Los Angeles, Jan. 27-29, 2004, Slide Nos. 1-22.

T. Matsuyama et al., "Nikon Projection Lens Update", Proc. Of SPIE vol. 5377, pp. 730-741, Mar. 2004.

Depth-of-Focus Enhancement Using High Refractive Index Layer on the Imaging Layer, IBM Technical Disclosure Bulletin, vol. 27, No. 11, Apr. 1985, p. 6521.

A. Suzuki, "Lithography Advances on Multiple Fronts", EEdesign, EE Times, Jan. 5, 2004.

B. Lin, The $\kappa_3$ coefficient in nonparaxial $\lambda$/NA scaling equations for resolution, depth of focus, and immersion lithography, J. Microlith., Microfab., Microsyst. 1(1):7-12 (Apr. 2002).

Emerging Lithographic Technologies VI, Proceedings of SPIE, vol. 4688 (2002), "Semiconductor Foundry, Lithography, and Partners", B.J. Lin, pp. 11-24.

Optical Microlithography XV, Proceedings of SPIE, vol. 4691 (2002), "Resolution Enhancement of 157 nm Lithography by Liquid Immersion", M. Switkes et al., pp. 459-465.

J. Microlith., Microfab., Microsyst., vol. 1 No. 3, Oct. 2002, Society of Photo-Optical Instrumentation Engineers, "Resolution enhancement of 157 nm lithography by liquid immersion", M. Switkes et al., pp. 1-4.

Nikon Corporation, 3$^{rd}$ 157 nm symposium, Sep. 4, 2002, "Nikon F2 Exposure Tool", Soichi Owa et al., 25 pages (slides 1-25).

Nikon Corporation, Immersion Lithography Workshop, Dec. 11, 2002, 24 pages (slides 1-24).

Optical Microlithography XVI, Proceedings of SPIE vol. 5040 (2003), "Immersion lithography; its potential performance and issues", Soichi Owa et al., pp. 724-733.

Nikon Corporation, Immersion Workshop, Jan. 27, 2004, "Update on 193 nm immersion exposure tool", S. Owa et al., 38 pages (slides 1-38).

Nikon Corporation, Litho Forum, Jan. 28, 2004, "Update on 193 nm immersion exposure tool", S. Owa et al., 51 pages (slides 1-51).

Jul. 14, 2005 Office Action in U.S. Appl. No. 11/141,518.

Feb. 15, 2006 Notice of Allowance in U.S. Appl. No. 11/141,518.

Apr. 17, 2006 Notice of Allowance in U.S. Appl. No. 11/141,518.

Aug. 3, 2006 Notice of Allowance in U.S. Appl. No. 11/141,518.

Nov. 1, 2006 Notice of Allowance in U.S. Appl. No. 11/141,518.

Feb. 22, 2007 Notice of Allowance in U.S. Appl. No. 11/141,518.

Apr. 25, 2006 Office Action in U.S. Appl. No. 11/372,269.

Dec. 16, 2008 Office Action in U.S. Appl. No. 11/585,824.

Sep. 30, 2009 Notice of Allowance in U.S. Appl. No. 11/585,824.

Feb. 24, 2010 Notice of Allowance in U.S. Appl. No. 11/585,824.

Jan. 5, 2010 Notice of Reasons of Rejection in Japanese Application No. 2003-412583, with translation.

Feb. 27, 2008 Supplementary European Search Report in European Application No. 03777348.8.

Aug. 19, 2008 Communication Pursuant to Article 94(3) in European Application No. 03777348.8.

Apr. 16, 2009 Communication Pursuant to Article 94(3) in European Application No. 03777348.8.

Mar. 27, 2007 Austrian Examination Report in Singapore Application No. 200503235-4.

Dec. 16, 2009 Australian Written Opinion in Singapore Application No. 200704812-7.

Mar. 12, 2009 Australian Written Opinion in Singapore Application No. 200704812-7.

Dec. 8, 2006 Chinese Office Action in Chinese Application No. 200380105422.5, with translation.

Jun. 22, 2010 Communication Pursuant to Article 94(3) in European Application No. 03777348.8.

Jun. 1, 2010 Office Action in Japanese Application No. 2003-412583, with translation.

\* cited by examiner

EXPOSURE APPARATUS AND METHOD FOR PRODUCING DEVICE

CROSS-REFERENCE

This is a Divisional of U.S. patent application Ser. No. 11/141,518 filed Jun. 1, 2005 (now U.S. Pat. No. 7,242,455), which in turn is a Continuation of International Application No. PCT/JP03/015667 filed Dec. 8, 2003 claiming the conventional priority of Japanese patent Application No. 2002-357962 filed on Dec. 10, 2002. The disclosures of these applications are incorporated by reference herein in their entireties.

BACKGROUND OF THE INVENTION

1. Field of the Invention

The present invention relates to a liquid immersion exposure apparatus and a liquid immersion exposure method for performing the exposure with an image of a pattern projected by a projection optical system in a state in which at least a part of a space between the projection optical system and a substrate is filled with a liquid. The present invention also relates to a method for producing a device by using the exposure apparatus.

2. Description of the Related Art

Semiconductor devices and liquid crystal display devices are produced with the so-called photolithography technique in which a pattern formed on a mask is transferred onto a photosensitive substrate. The exposure apparatus, which is used in the photolithography step, includes a mask stage for supporting the mask and a substrate stage for supporting the substrate. The pattern on the mask is transferred onto the substrate via a projection optical system while successively moving the mask stage and the substrate stage. In recent years, it is demanded to realize the higher resolution of the projection optical system in order to respond to the further advance of the higher integration of the device pattern. As the exposure wavelength to be used is shorter, the resolution of the projection optical system becomes higher. As the numerical aperture of the projection optical system is larger, the resolution of the projection optical system becomes higher. Therefore, the exposure wavelength, which is used for the exposure apparatus, is shortened year by year, and the numerical aperture of the projection optical system is increased as well. The exposure wavelength, which is dominantly used at present, is 248 nm of the KrF excimer laser. However, the exposure wavelength of 193 nm of the ArF excimer laser, which is shorter than the above, is also practically used in some situations. When the exposure is performed, the depth of focus (DOF) is also important in the same manner as the resolution. The resolution R and the depth of focus δ are represented by the following expressions respectively.

$$R = k_1 \cdot \lambda / NA \quad (1)$$

$$\delta = \pm k_2 \cdot \lambda / NA^2 \quad (2)$$

In the expressions, λ represents the exposure wavelength, NA represents the numerical aperture of the projection optical system, and $k_1$ and $k_2$ represent the process coefficients. According to the expressions (1) and (2), the following fact is appreciated. That is, when the exposure wavelength λ is shortened and the numerical aperture NA is increased in order to enhance the resolution R, then the depth of focus δ is narrowed.

If the depth of focus δ is too narrowed, it is difficult to match the substrate surface with respect to the image plane of the projection optical system. It is feared that the margin is insufficient during the exposure operation. Accordingly, the liquid immersion method has been suggested, which is disclosed, for example, in International Publication No. 99/49504 as a method for substantially shortening the exposure wavelength and widening the depth of focus. In this liquid immersion method, the space between the lower surface of the projection optical system and the substrate surface is filled with a liquid such as water or any organic solvent to utilize the fact that the wavelength of the exposure light beam in the liquid is 1/n as compared with that in the air (n represents the refractive index of the liquid, which is about 1.2 to 1.6 in ordinary cases) so that the resolution is improved and the depth of focus is magnified about n times.

In the exposure apparatus as described above, the detecting light beam is radiated onto the substrate surface during the exposure of the substrate, and the substrate surface position is detected by receiving the reflected light beam. The positional relationship between the substrate surface and the image plane of the pattern formed through the projection optical system is appropriately adjusted on the basis of the result of the detection. However, in the case of the liquid immersion exposure apparatus based on the liquid immersion method, the liquid exists between the projection optical system and the substrate, which brings about the following possibility. That is, it is impossible to correctly detect the surface position of the substrate surface by being affected, for example, by the temperature change of the liquid, and the positional relationship between the image plane of the pattern and the substrate surface is not adjusted appropriately. Similarly, when the alignment mark on the substrate is detected through the liquid, the following possibility arises. That is, it is impossible to correctly detect the mark on the substrate by being affected, for example, by the temperature change of the liquid, and the positional alignment between the mask and the substrate is not performed correctly.

SUMMARY OF THE INVENTION

The present invention has been made taking the circumstances as described above into consideration, an object of which is to provide a liquid immersion exposure apparatus and a liquid immersion exposure method which make it possible to expose a substrate at a satisfactory pattern transfer accuracy when the exposure process is performed in a state in which a space between a projection optical system and the substrate is filled with a liquid. Another object of the present invention is to provide a liquid immersion exposure apparatus and a liquid immersion exposure method which make it possible to bring about an optimum state by adjusting the positional relationship between a substrate surface and an image plane of a pattern. Still another object of the present invention is to provide a liquid immersion exposure apparatus and a liquid immersion exposure method which make it possible to correctly perform the positional alignment (alignment) for a substrate.

In order to achieve the objects as described above, the present invention adopts the following constructions.

According to a first aspect of the present invention, there is provided an exposure apparatus for exposing a substrate by transferring an image of a pattern through a liquid onto the substrate, comprising a projection optical system which projects the image of the pattern onto the substrate; a first substrate stage which holds the substrate; a liquid supply unit which supplies the liquid to a side of an image plane of the projection optical system; and a surface-detecting system which detects surface information about a surface of the substrate not through the liquid; wherein the substrate is subjected to liquid immersion exposure while adjusting a positional relationship between the surface of the substrate and the image plane formed through the liquid by the projection optical system on the basis of the detected surface information.

According to the present invention, the surface information about the substrate surface is detected not through the liquid for the liquid immersion exposure, and then the liquid immersion exposure is performed on the basis of the information. Therefore, it is possible to correctly perform the adjustment of the positional relationship between the substrate surface and the image plane formed through the liquid, and the positional alignment between each of the shot areas on the substrate and the projection position of the pattern image, without being affected, for example, by the temperature change of the liquid. Further, it is unnecessary to construct any other alignment system in order to respond to the liquid immersion. The conventional detecting system can be utilized as it is.

According to a second aspect of the present invention, there is provided an exposure apparatus for exposing a plurality of shot areas on a substrate by successively exposing the plurality of shot areas on the substrate with an image of a pattern through a liquid; the exposure apparatus comprising a projection optical system which projects the image of the pattern onto the substrate; a first substrate stage which holds the substrate; a liquid supply unit which supplies the liquid to a side of an image plane of the projection optical system; and a first alignment system which detects an alignment mark on the substrate not through the liquid; wherein the substrate is subjected to liquid immersion exposure while performing alignment of the substrate and the pattern on the basis of a result of the detection performed by the first alignment system.

According to the present invention, the alignment mark on the substrate is detected not through the liquid for the liquid immersion exposure, and then the liquid immersion exposure is performed on the basis of the information. Therefore, it is possible to correctly perform the adjustment of the positional relationship between the substrate surface and the image plane formed through the liquid, and the positional alignment between each of the shot areas on the substrate and the projection position of the pattern image, without being affected, for example, by the temperature change of the liquid, in the same manner as in the exposure apparatus according to the first aspect. Further, it is unnecessary to construct any other alignment system in order to respond to the liquid immersion. The conventional detecting system can be utilized as it is.

According to the present invention, there is provided a method for producing a device, characterized by using the exposure apparatus as defined in any one of the aspects described above.

According to a third aspect of the present invention, there is provided a liquid immersion exposure method for exposing a substrate by transferring an image of a pattern onto the substrate through a liquid; the liquid immersion exposure method comprising a step of determining a surface information about a substrate surface by performing measurement not through the liquid supplied onto the substrate; a step of supplying the liquid onto the substrate; and a step of performing liquid immersion exposure for the substrate while adjusting a positional relationship between the substrate surface and an image plane formed through the liquid on the basis of the determined surface information. According to this method, the surface information about the substrate surface is determined by the measurement not through the liquid. Therefore, it is possible to execute the positioning for the substrate correctly and easily without being effected by any physical change such as the temperature change of the liquid.

According to a fourth aspect of the present invention, there is provided a liquid immersion exposure method for exposing a substrate by transferring an image of a pattern onto the substrate through a liquid, comprising a step of detecting an alignment mark on the substrate when the liquid is not supplied onto the substrate; a step of supplying the liquid onto the substrate; and a step of performing liquid immersion exposure for the substrate while performing alignment of the pattern and the substrate onto which the liquid has been supplied, on the basis of a result of the detection of the alignment mark. According to this method, the alignment is performed for the shot area on the substrate in the state not through the liquid (dry condition). Therefore, it is possible to execute the positioning for the shot area on the substrate correctly and easily without being effected by any physical change such as the temperature change of the liquid to be used for the liquid immersion exposure. On the other hand, the exposure operation is performed in the state in which the liquid is supplied (wet condition). Therefore, it is possible to perform the exposure with a wide depth of focus. Further, the conventional apparatus can be used for the alignment system. Therefore, it is possible to suppress the increase in the equipment cost which would be otherwise increased when the liquid immersion exposure is performed.

DESCRIPTION OF THE PREFERRED
EMBODIMENTS OF THE INVENTION

Figure 1:
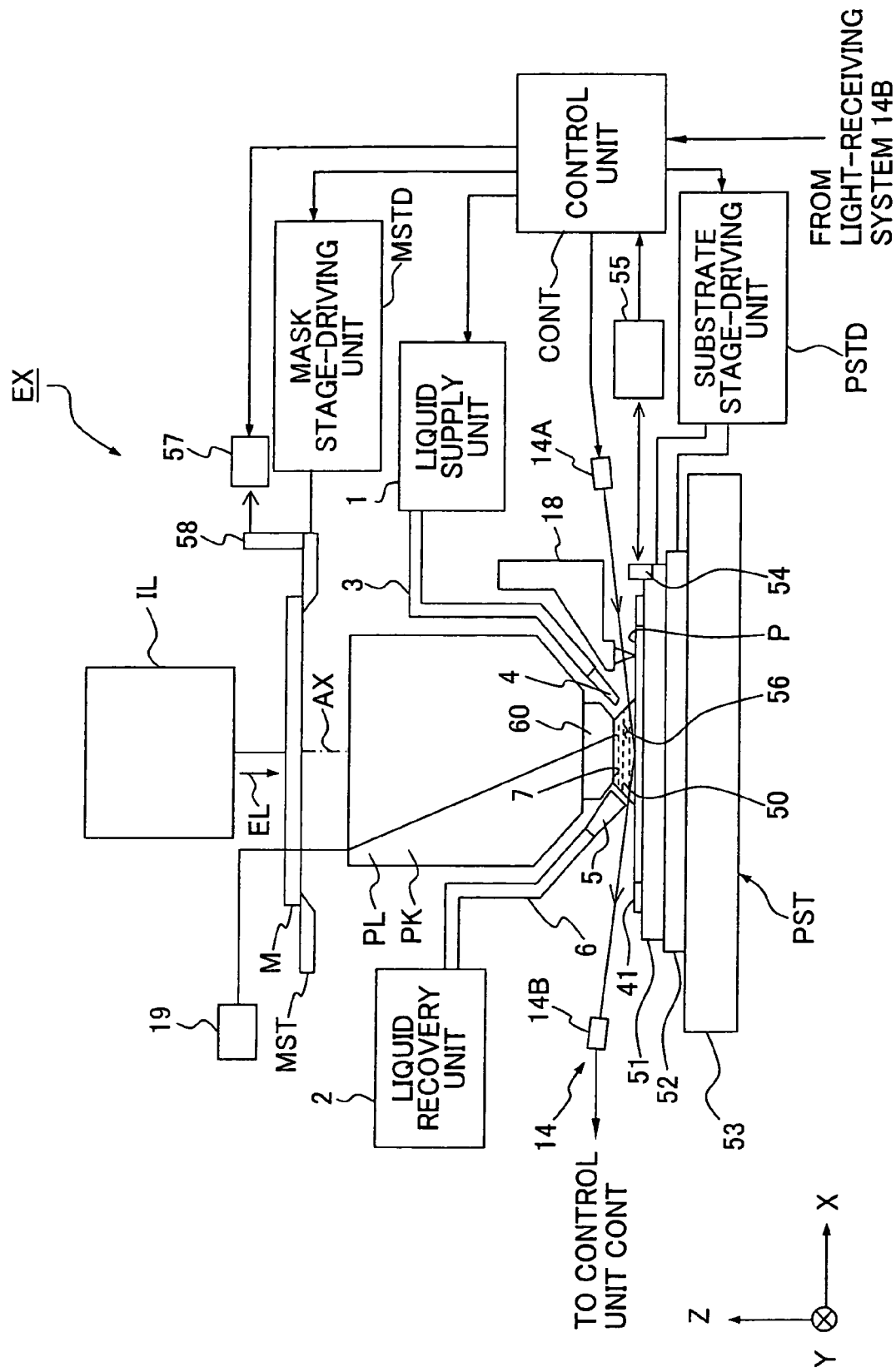
FIG. 1 shows a schematic arrangement illustrating an embodiment of the exposure apparatus of the present invention.

An explanation will be made below about the exposure apparatus and the method for producing the device according to the present invention. FIG. 1 shows a schematic arrangement illustrating an embodiment of the exposure apparatus of the present invention.

With reference to FIG. 1, an exposure apparatus EX includes a mask stage MST which supports a mask M, a substrate stage PST which supports a substrate P, an illumination optical system IL which illuminates, with an exposure light beam EL, the mask M supported by the mask stage MST, a projection optical system PL which performs projection exposure for the substrate P supported by the substrate stage PST with an image of a pattern of the mask M illuminated with the exposure light beam EL, and a control unit CONT which collectively controls the overall operation of the exposure apparatus EX.

The embodiment of the present invention will now be explained as exemplified by a case of the use of the scanning type exposure apparatus (so-called scanning stepper) as the exposure apparatus EX in which the substrate P is exposed with the pattern formed on the mask M while synchronously moving the mask M and the substrate P in mutually different directions (opposite directions) in the scanning directions. In the following explanation, the Z axis direction resides in the direction which is coincident with the optical axis AX of the projection optical system PL, the X axis direction resides in the synchronous movement direction (scanning direction) for the mask M and the substrate P in the plane perpendicular to the Z axis direction, and Y axis direction resides in the direction (non-scanning direction) perpendicular to the Z axis direction and the Y axis direction. The directions about the X axis, the Y axis, and the X axis are designated as θX, θY, and θZ directions respectively. The term "substrate" referred to herein includes those obtained by applying a resist on a semiconductor wafer, and the term "mask" includes a reticle formed with a device pattern to be subjected to the reduction projection onto the substrate.

The illumination optical system IL is used so that the mask M, which is supported on the mask stage MST, is illuminated with the exposure light beam EL. The illumination optical system IL includes, for example, an exposure light source, an optical integrator which uniformizes the illuminance of the light flux radiated from the exposure light source, a condenser lens which collects the exposure light beam EL supplied from the optical integrator, a relay lens system, and a variable field diaphragm which sets the illumination area on the mask M illuminated with the exposure light beam EL to be slit-shaped. The predetermined illumination area on the mask M is illuminated with the exposure light beam EL having a uniform illuminance distribution by the illumination optical system IL. Those usable as the exposure light beam EL radiated from the illumination optical system IL include, for example, emission lines (g-ray, h-ray, i-ray) in the ultraviolet region radiated, for example, from a mercury lamp, far ultraviolet light beams (DUV light beams) such as the KrF excimer laser beam (wavelength: 248 nm), and vacuum ultraviolet light beams (VUV light beams) such as the ArF excimer laser beam (wavelength: 193 nm) and the $F_2$ laser beam (wavelength: 157 nm). In this embodiment, the ArF excimer laser beam is used.

The mask stage MST supports the mask M. The mask stage MST is two-dimensionally movable in the plane perpendicular to the optical axis AX of the projection optical system PL, i.e., in the XY plane, and it is finely rotatable in the θZ direction. The mask stage MST is driven by a mask stage-driving unit MSTD such as a linear motor. The mask stage-driving unit MSTD is controlled by the control unit CONT. A movement mirror 58 is provided on the mask stage MST. A laser interferometer 57 is provided at a position opposed to the movement mirror 58. The position in the two-dimensional direction and the angle of rotation of the mask M on the mask stage MST are measured in real-time by the laser interferometer 57. The result of the measurement is outputted to the control unit CONT. The control unit CONT drives the mask stage-driving unit MSTD on the basis of the result of the measurement obtained by the laser interferometer 57 to thereby position the mask M supported on the mask stage MST.

The projection optical system PL projects the pattern on the mask M onto the substrate P at a predetermined projection magnification β to perform the exposure. The projection optical system PL includes a plurality of optical elements (lenses). The optical elements are supported by a barrel PK as a metal member. In this embodiment, the projection optical system PL is based on the reduction system having the projection magnification β which is, for example, ¼ or ⅕. The projection optical system PL may be any one of the 1× magnification system and the magnifying system. The optical element (lens) 60 is exposed from the barrel PK on the side of the tip (on the side of the substrate P) of the projection optical system PL of this embodiment. The optical element 60 is provided detachably (exchangeably) with respect to the barrel PK.

The substrate stage (first substrate stage) PST supports the substrate P. The substrate stage PST comprises a Z stage 51 which holds the substrate P by the aid of a substrate holder, an XY stage 52 which supports the Z stage 51, and a base 53 which supports the XY stage 52. The substrate stage PST is driven by a substrate stage-driving unit PSTD such as a linear motor. The substrate stage-driving unit PSTD is controlled by the control unit CONT.

The surface information about the surface of the substrate P (inclination information and position information in the Z axis direction) is detected by a focus/leveling-detecting system 14 as a surface-detecting system. The focus/leveling-detecting system 14 includes a light-emitting system 14A which emits a detecting light beam onto the surface of the substrate P, and a light-receiving system 14B which receives a reflected light beam from the substrate P. The result of detection of the focus/leveling-detecting system 14 is outputted to the control unit CONT. The control unit CONT drives the Z stage 51 on the basis of the result of the detection of the focus/leveling-detecting system 14 to adjust the position (focus position) in the Z axis direction and the angle of inclination of the substrate P held on the Z stage 51. Accordingly, the surface of the substrate P is adjusted to match the optimum state with respect to the image plane of the projection optical system PL in the auto-focus manner and the auto-leveling manner. The Z stage and the XY stage may be formed as an integrated body.

A movement mirror 54, which is movable together with the substrate stage PST with respect to the projection optical system PL, is provided on the substrate stage PST (Z stage 51). A laser interferometer 55 is provided at a position opposed to the movement mirror 54. The angle of rotation and the position in the two-dimensional direction of the substrate P on the substrate stage PST are measured in real-time by the laser interferometer 55. The result of the measurement is outputted to the control unit CONT. The control unit CONT drives the XY stage 52 by the aid of the substrate stage-driving unit PSTD on the basis of the result of the measurement of the laser interferometer 55 to thereby adjust the position of the substrate P in the XY directions (position in the directions substantially parallel to the image plane of the projection optical system PL). Thus, the substrate P, which is supported on the substrate stage PST, is positioned.

A substrate alignment system (first alignment system) 18, which detects an alignment mark on the substrate P or a fiducial mark provided on the Z stage 51 (as described later on), is arranged in the vicinity of the tip of the projection optical system PL. A mask alignment system (second alignment system) 19, which detects a fiducial mark on the Z stage 51 through the mask M and the projection optical system PL, is provided in the vicinity of the mask stage MST.

An arrangement of the autofocus/leveling detecting system 14 is disclosed, for example, in Japanese Patent Application Laid-open No. 8-37149 (corresponding to U.S. Pat. No. 6,195,154). An arrangement of the substrate alignment system 18 is disclosed in Japanese Patent Application Laid-open No. 4-65603 (corresponding to U.S. Pat. No. 5,493,403). Further, an arrangement of the mask alignment system 19 is disclosed in Japanese Patent Application Laid-open No. 7-176468 (corresponding to U.S. Pat. No. 5,646,413). The disclosures of these documents are incorporated herein by reference within a range of permission of the domestic laws and ordinances of the state designated or selected in this international application.

In this embodiment, the liquid immersion method is applied in order that the resolution is improved by substantially shortening the exposure wavelength and the depth of focus is substantially widened. Therefore, the space between the surface of the substrate P and the tip surface (lower surface) 7 of the optical element (lens) 60 of the projection optical system PL on the side of the substrate P is filled with the predetermined liquid 50 at least during the period in which the image of the pattern on the mask M is transferred onto the substrate P. As described above, the lens 60 is exposed on the tip side of the projection optical system PL, and the liquid 50 is supplied to make contact with only the lens 60. Accordingly, the barrel PK composed of the metal is prevented from any corrosion or the like. In this embodiment, pure water is used for the liquid 50. The exposure light beam EL, which is not limited to only the ArF excimer laser beam, can be transmitted through pure water, even when the exposure light beam EL is, for example, the emission line (g-ray, h-ray, i-ray) in the ultraviolet region radiated, for example, from a mercury lamp or the far ultraviolet light beam (DUV light beam) such as the KrF excimer laser beam (wavelength: 248 nm).

The exposure apparatus EX includes a liquid supply unit 1 which supplies the predetermined liquid 50 to the space 56 between the substrate P and the tip surface (end surface of the lens 60) 7 of the projection optical system PL, i.e., to the side of the image plane of the projection optical system PL, and a liquid recovery unit 2 which recovers the liquid 50 from the space 56. The liquid supply unit 1 is provided to fill at least a part of the space between the projection optical system PL and the substrate P with the liquid 50. The liquid supply unit 1 includes, for example, a tank for accommodating the liquid 50, and a pressurizing pump. One end of a supply tube 3 is connected to the liquid supply unit 1. Supply nozzles 4 are connected to the other end of the supply tube 3. The liquid supply unit 1 supplies the liquid 50 to the space 56 through the supply tube 3 and the supply nozzles 4.

The liquid recovery unit 2 includes, for example, a suction pump, and a tank for accommodating the recovered liquid 50. One end of a recovery tube 6 is connected to the liquid recovery unit 2. Recovery nozzles 5 are connected to the other end of the recovery tube 6. The liquid recovery unit 2 recovers the liquid 50 from the space 56 through the recovery nozzles 5 and the recovery tube 6. When the space 56 is filled with the liquid 50, then the control unit CONT drives the liquid supply unit 1 so that the liquid 50, which is in a predetermined amount per unit time, is supplied to the space 56 through the supply tube 3 and the supply nozzles 4, and the control unit CONT drives the liquid recovery unit 2 so that the liquid 50, which is in a predetermined amount per unit time, is recovered from the space 56 via the recovery nozzles 5 and the recovery tube 6. Accordingly, the liquid 50 is retained in the space 56 between the substrate P and the tip surface 7 of the projection optical system PL. The temperature of the liquid 50 is set, for example, to be approximately the same as the temperature in the chamber in which the exposure apparatus EX is accommodated.

Figure 2:
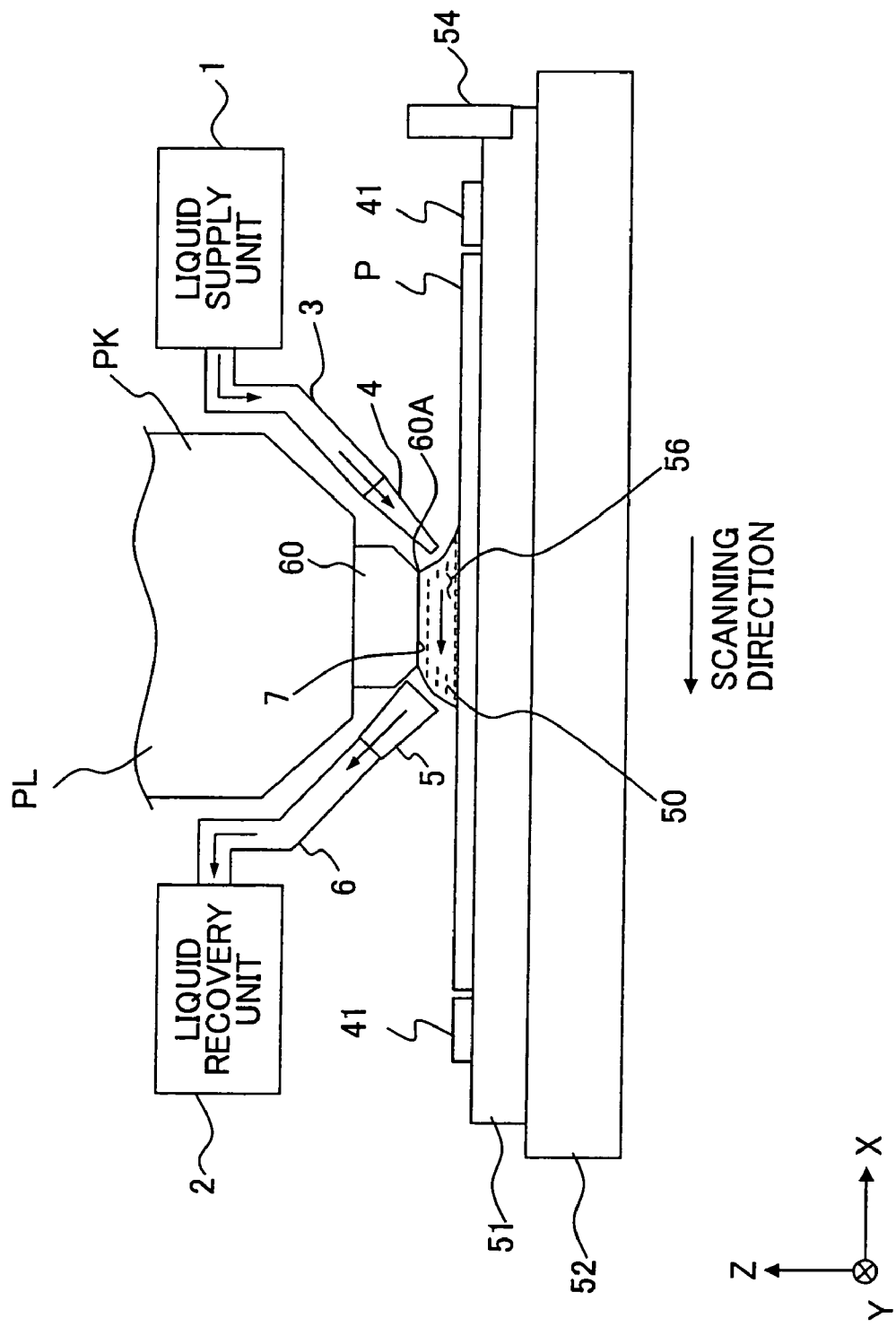
FIG. 2 shows a positional relationship among a tip of a projection optical system, a liquid supply unit, and a liquid recovery unit.

FIG. 2 shows a partial magnified view of FIG. 1 illustrating, for example, the lower portion of the projection optical system PL of the exposure apparatus EX, the liquid supply unit 1, and the liquid recovery unit 2. In FIG. 2, the lens 60, which is disposed at the lowest end of the projection optical system PL, is formed to have a rectangular shape which is long in the Y axis direction (non-scanning direction) except for the portion required for the end portion 60A in the scanning direction. During the scanning exposure, a pattern image of a part of the mask M is projected onto the rectangular projection area disposed just under the end portion 60A. The mask M is moved at the velocity V in the −X direction (or in the +X direction) with respect to the projection optical system PL, in synchronization with which the substrate P is moved at the velocity β·V (β is the projection magnification) in the +X direction (or in the −X direction) by the aid of the XY stage 52. After the completion of the exposure for one shot area, the next shot area is moved to the scanning start position in accordance with the stepping of the substrate P. The exposure process is successively performed thereafter for each of the shot areas in accordance in the step-and-scan manner. This embodiment is designed so that the liquid 50 flows in the movement direction of the substrate P.

Figure 3:
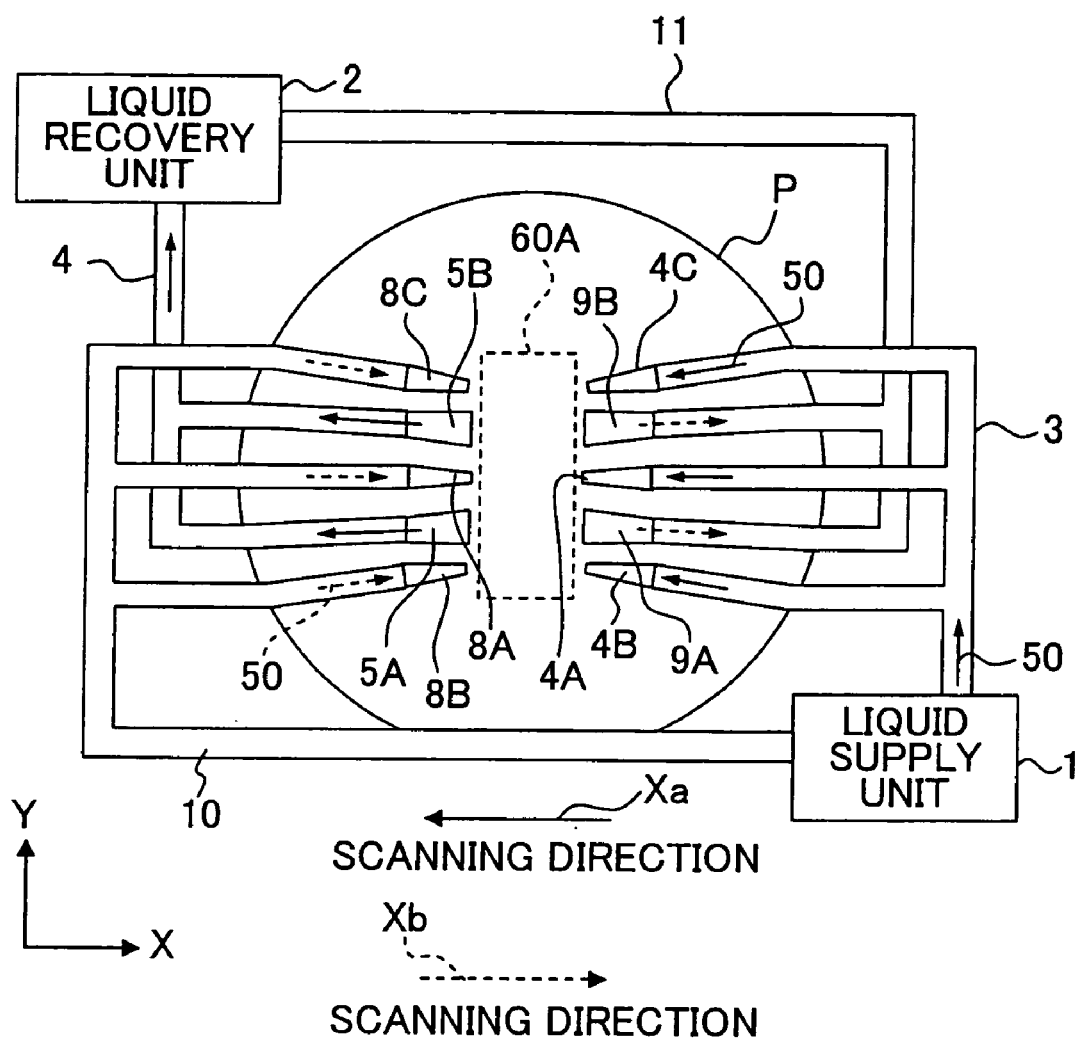
FIG. 3 shows an exemplary arrangement of supply nozzles and recovery nozzles.

FIG. 3 shows the positional relationship among the end portion 60A of the projection optical system PL, the supply nozzles 4 (4A to 4C) for supplying the liquid 50 in the X axis direction, and the recovery nozzles 5 (5A, 5B) for recovering the liquid 50. In FIG. 3, the end portion 60A of the lens 60 has a rectangular shape which is long in the Y axis direction. The three supply nozzles 4A to 4C are arranged on the side in the +X direction, and the two recovery nozzles 5A, 5B are arranged on the side in the −X direction so that the end portion 60A of the lens 60 of the projection optical system PL is interposed thereby. The supply nozzles 4A to 4C are connected to the liquid supply unit 1 through the supply tube 3, and the recovery nozzles 5A, 5B are connected to the liquid recovery unit 2 through the recovery tube 4. Further, the supply nozzles 8A to 8C and the recovery nozzles 9A, 9B are arranged at positions obtained by rotating, by substantially 180°, the positions of the supply nozzles 4A to 4C and the recovery nozzles 5A, 5B about the center of the end portion 60A. The supply nozzles 4A to 4C and the recovery nozzles 9A, 9B are alternately arranged in the Y axis direction. The supply nozzles 8A to 8C and the recovery nozzles 5A, 5B are alternately arranged in the Y axis direction. The supply nozzles 8A to 8C are connected to the liquid supply unit 1 through the supply tube 10. The recovery nozzles 9A, 9B are connected to the liquid recovery unit 2 through the recovery tube 11.

When the scanning exposure is performed by moving the substrate P in the scanning direction (−X direction) indicated by the arrow Xa, the liquid 50 is supplied and recovered with the liquid supply unit 1 and the liquid recovery unit 2 by using the supply tube 3, the supply nozzles 4A to 4C, the recovery tube 4, and the recovery nozzles 5A, 5B. That is, when the substrate P is moved in the −X direction, then the liquid 50 is supplied to the space between the projection optical system PL and the substrate P from the liquid supply unit 1 by the aid of the supply tube 3 and the supply nozzles 4 (4A to 4C), and the liquid 50 is recovered to the liquid recovery unit 2 by the aid of the recovery nozzles 5 (5A, 5B) and the recovery tube 6. The liquid 50 flows in the −X direction so that the space between the lens 60 and the substrate P is filled therewith. On the other hand, when the scanning exposure is performed by moving the substrate P in the scanning direction (+X direction) indicated by the arrow Xb, then the liquid 50 is supplied and recovered with the liquid supply unit 1 and the liquid recovery unit 2 by using the supply tube 10, the supply nozzles 8A to 8C, the recovery tube 11, and the recovery nozzles 9A, 9B. That is, when the substrate P is moved in the +X direction, then the liquid 50 is supplied from the liquid supply unit 1 to the space between the projection optical system PL and the substrate P by the aid of the supply tube 10 and the supply nozzles 8 (8A to 8C), and the liquid 50 is recovered to the liquid recovery unit 2 by the aid of the recovery nozzles 9 (9A, 9B) and the recovery tube 11. The liquid 50 flows in the +X direction so that the space between the lens 60 and the substrate P is filled therewith. As described above, the control unit CONT makes the liquid 50 to flow in the same direction as the movement direction of the substrate P in accordance with the movement direction of the substrate P by using the liquid supply unit 1 and the liquid recovery unit 2. In this arrangement, for example, the liquid 50, which is supplied from the liquid supply unit 1 via the supply nozzles 4, flows so that the liquid 50 is attracted and introduced into the space 56 in accordance with the movement of the substrate P in the −X direction. Therefore, even when the supply energy of the liquid supply unit 1 is small, the liquid 50 can be supplied to the space 56 with ease. When the direction, in which the liquid 50 is made to flow, is switched depending on the scanning direction, then it is possible to fill the space between the substrate P and the tip surface 7 of the lens 60 with the liquid 50, and it is possible to obtain the high resolution and the wide depth of focus, even when the substrate P is subjected to the scanning in any one of the +X direction and the −X direction.

There is no special limitation to the shape of the nozzle described above. For example, two pairs of nozzles may be used for the long side of the end portion 60A to supply and recover the liquid 50. In this arrangement, the supply nozzles and the recovery nozzles may be arranged and aligned vertically in order that the liquid 50 can be supplied and recovered in any one of the +X direction and the −X direction. Although not shown, the nozzles, which are used to supply and recover the liquid 50, are provided at predetermined intervals around the lens 60 of the projection optical system PL. Even when the substrate P is moved in any direction other than the scanning direction (+X direction, −X direction), it is possible to made the liquid 50 to flow in the same direction as the movement direction of the substrate P in parallel to the movement direction of the substrate P.

Figure 4:
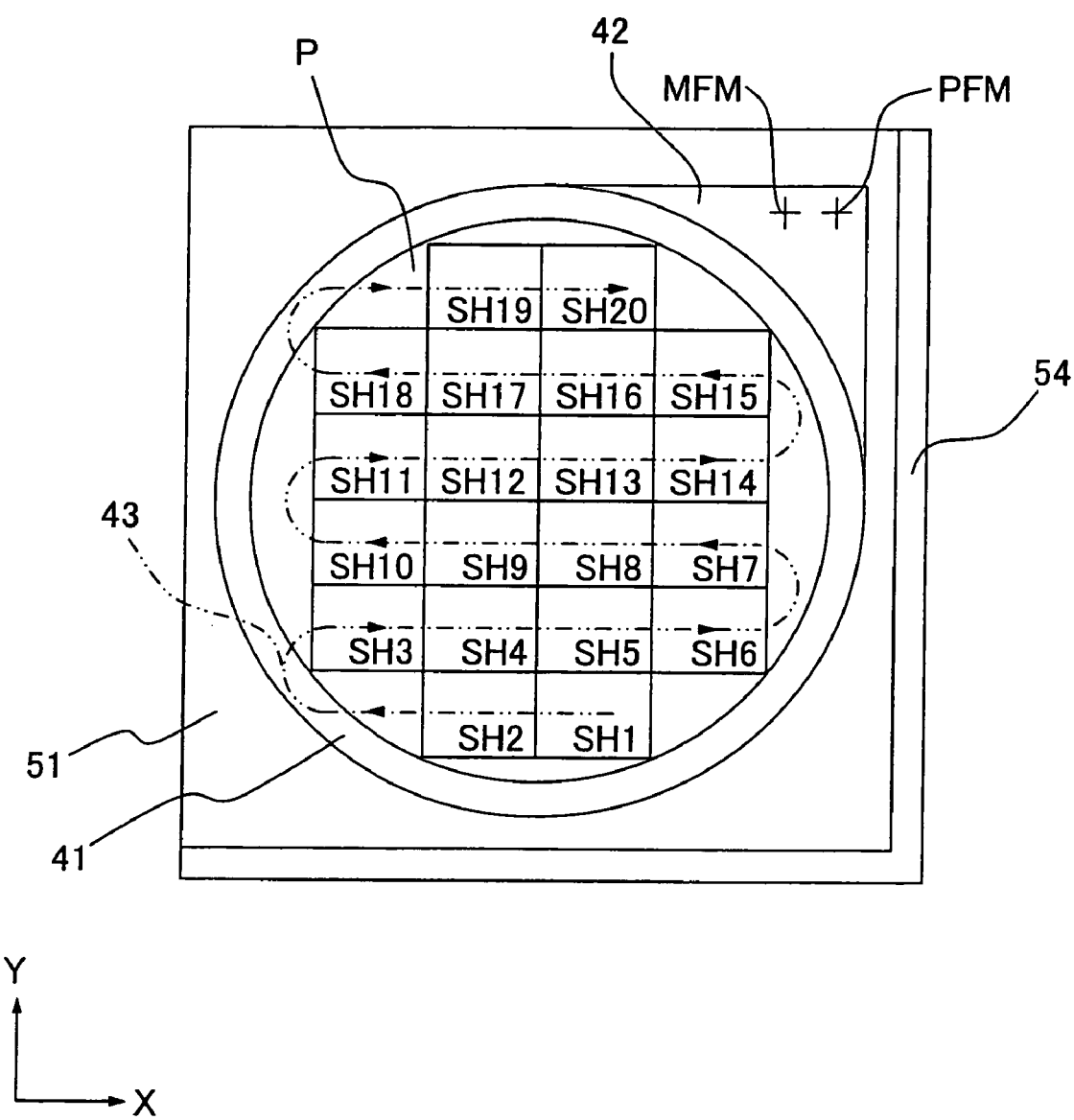
FIG. 4 shows a plan view illustrating a substrate stage for holding a substrate.

FIG. 4 shows a schematic plan view illustrating the Z stage 51 as viewed from an upper position. The movement mirror 54 is arranged on the mutually perpendicular two side surfaces of the rectangular Z stage 51. The substrate P is held by the aid of an unillustrated holder at a substantially central portion of the Z stage 51. A plurality of shot areas SH1 to SH20 are set on the substrate P. An auxiliary plate 41, which has a flat surface having approximately the same height as that of (flush with) the surface of the substrate P, is provided around the substrate P. There is a gap of about 1 to 2 mm between the edge of the substrate P and the auxiliary plate 41. However, the liquid 50 scarcely flows into the gap owing to the surface tension of the liquid 50. It is possible to retain the liquid 50 under the projection optical system PL even when the exposure is performed for those disposed in the vicinity of the circumferential edge of the substrate P.

A fiducial plate (reference member) 42 is provided integrally with the auxiliary plate 41 at one corner of the Z stage 51. The fiducial plate 42 is provided with a fiducial mark PFM to be detected by the substrate alignment system 18, and a fiducial mark MFM to be detected by the mask alignment system 19, while the fiducial mark PFM and the fiducial mark MFM are provided in a predetermined positional relationship. The surface of the fiducial plate 42 is substantially flat, which also functions as a fiducial surface or reference plane for the focus/leveling-detecting system 14. The fiducial surface for the focus/leveling-detecting system 14 may be provided on the Z stage 51 separately from the fiducial plate 42. The fiducial plate 42 may be provided while being separated from the auxiliary plate 41 by about 1 to 2 mm. The fiducial mark PFM and the fiducial mark MFM may be provided on different members respectively. Further, the surface of the fiducial plate 42 is set to have approximately the same height as that of the surface of the substrate P and the surface of the auxiliary plate 41. The liquid immersion portion, which is disposed under the projection optical system PL, can be moved between the fiducial plate 42 and the substrate P while retaining the liquid 50 under the projection optical system PL.

Figure 8:
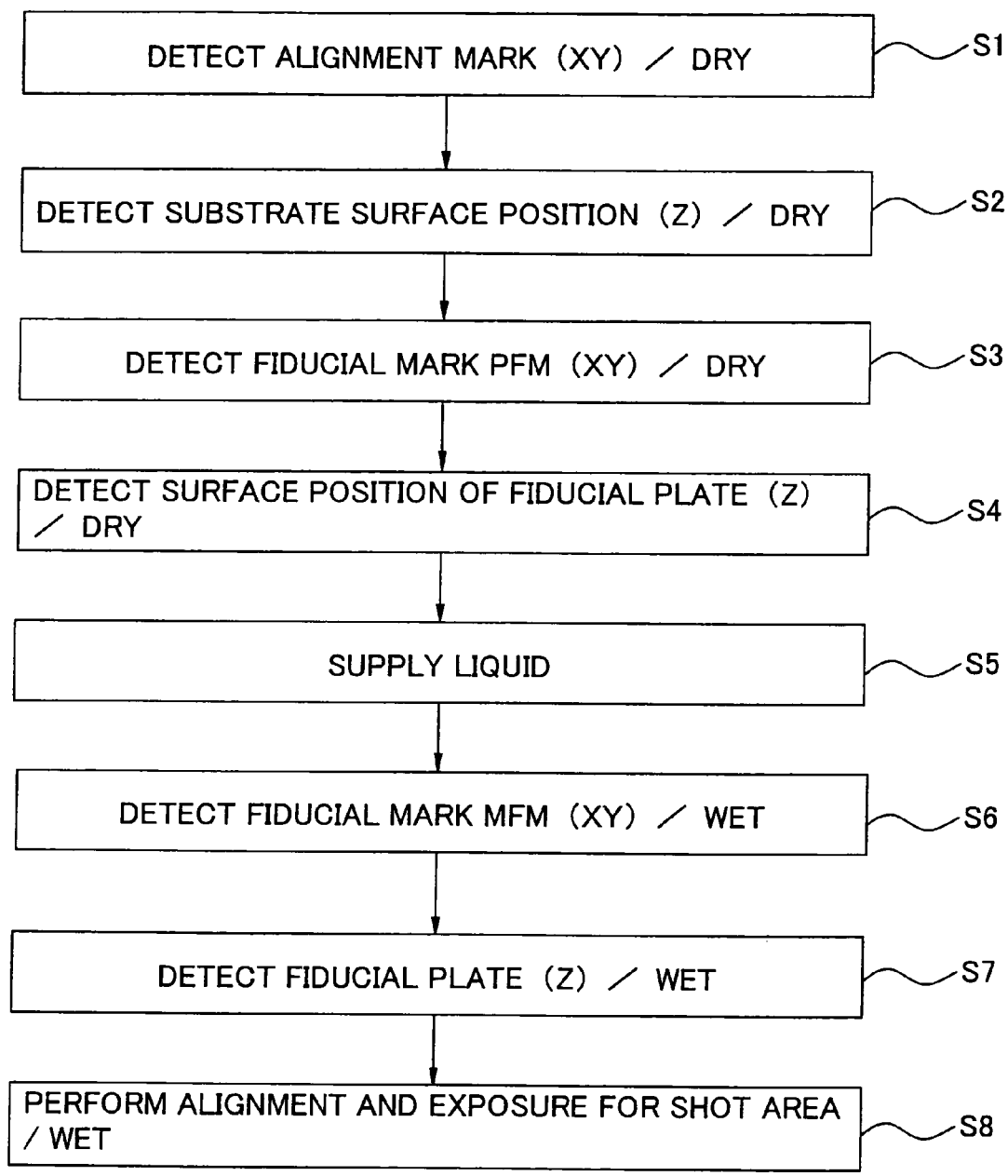
FIG. 8 shows a flow chart illustrating a procedure for exposing a substrate with a mask pattern by using the exposure apparatus.

Next, an explanation will be made with reference to a flow chart shown in FIG. 8 about a procedure for exposing the substrate P with the pattern of the mask M by using the exposure apparatus EX described above.

Detection of Alignment Mark (XY Directions) Under Dry Condition

The measurement process is firstly performed in a state in which the liquid is absent on the substrate P before supplying the liquid 50 from the liquid supply unit 1. The control unit CONT moves the XY stage 52 while monitoring the output of the laser interferometer 55 so that the optical axis AX of the projection optical system PL follows the broken line arrow 43 shown in FIG. 4 over the shot areas SH1 to SH20. During this movement, the substrate alignment system 18 detects the plurality of alignment marks (not sown) formed on the substrate P not through the liquid (S1). The XY stage 52 is stopped when the substrate alignment system 18 detects the alignment mark. As a result, the position information about the respective alignment marks in the coordinate system defined by the laser interferometer 55 is measured. As for the detection of the alignment marks by the substrate alignment system 18, all of the alignment marks on the substrate P may be detected, or only a part of the alignment marks may be detected. When the substrate alignment system 18 can detect the alignment mark on the substrate P while moving over the substrate P, it is also allowable that the XY stage 52 is not stopped.

Detection of Substrate Surface Position (Z Direction) Under Dry Condition

During the movement of the XY stage 52, the surface information about the substrate P is detected by the focus/leveling-detecting system 14 not through the liquid (S2). The surface information is detected by the focus/leveling-detecting system 14 for all of the shot areas SH1 to SH20 on the substrate P one by one. The result of the detection is stored in the control unit CONT while corresponding to the position of the substrate P in the scanning direction (X axis direction). The detection of the surface information by the focus/leveling-detecting system 14 may be performed for only a part of the shot areas.

The way of the movement of the XY stage 52 is not limited to the locus shown in FIG. 4. The movement may be effected so that the desired detecting operation can be performed while making the distance as short as possible. Alternatively, one of the detection of the position information about the plurality of alignment marks and the detection of the surface information about the substrate P may be completed ahead of the other, and then the other detection may be executed thereafter.

Detection of Fiducial Mark PFM (XY Directions) Under Dry Condition

When the detection of the alignment marks on the substrate P and the detection of the surface information about the substrate P are completed, the control unit CONT moves the XY stage 52 so that the detection area of the substrate alignment system 18 is positioned on the fiducial plate 42. The substrate alignment system 18 detects the fiducial mark PFM on the fiducial plate 42 to measure the position information about the fiducial mark PFM in the coordinate system defined by the laser interferometer 55 (S3).

When the process for detecting the fiducial mark PFM is completed, the positional relationship between the fiducial mark PFM and the plurality of alignment marks on the substrate P is determined. The positional relationship between the plurality of alignment marks and the shot areas SH1 to SH20 is already known. Therefore, when the positional relationship between the fiducial mark PFM and the plurality of alignment marks on the substrate P is determined, the positional relationships between the fiducial mark PFM and the plurality of shot areas SH1 to SH20 on the substrate P are consequently determined respectively. The predetermined positional relationship holds between the fiducial mark PFM and the fiducial mark MFM. Therefore, the positional relationships between the fiducial mark MFM and the plurality of shot areas SH1 to SH20 on the substrate in the XY plane are consequently determined respectively.

Detection of Surface Position of Fiducial Plate (Z Direction) Under Dry Condition The control unit CONT detects the surface information about the surface of the fiducial plate 42 (fiducial surface) by using the focus/leveling-detecting system 14 (S4) before or after the detection of the fiducial mark PFM by the substrate alignment system 18. When the process for detecting the surface of the fiducial plate 42 is completed, the positional relationship between the fiducial plate 42 and the surface of the substrate P is consequently determined.

Detection of Fiducial Mark MFM (XY Directions) Under Wet Condition

Subsequently, the control unit CONT moves the XY stage 52 so that the fiducial mark MFM on the fiducial plate 42 can be detected by the mask alignment system 19. Of course, the end portion 60A of the projection optical system PL is opposed to the fiducial plate 42 in this state. In this situation, the control unit CONT starts the supply and the recovery of the liquid 50 with the liquid supply unit 1 and the liquid recovery unit 2 to fill the space between the projection optical system PL and the fiducial plate 42 with the liquid 50 (S5).

Subsequently, the control unit CONT performs the detection of the fiducial mark MFM through the mask M, the projection optical system PL, and the liquid 50 by using the mask alignment system 19 (S6). That is, the positional relationship between the mark on the mask M and the fiducial mark MFM is detected through the projection optical system PL and the liquid. Accordingly, the position of the mask M in the XY plane, i.e., the information about the projection position of the image of the pattern on the mask M is consequently detected through the projection optical system PL and the liquid 50 by using the fiducial mark MFM.

Detection of Fiducial Plate (Z Direction) Under Wet Condition

The control unit CONT detects the surface of the fiducial plate 42 (fiducial surface) by using the focus/leveling-detecting system 14 in a state in which the liquid 50 is supplied to the space between the projection optical system PL and the fiducial plate 42 to measure the relationship between the surface of the fiducial plate 42 and the image plane formed through the projection optical system PL and the liquid 50 (S7). The focus/leveling-detecting system 14 is constructed so that the positional relationship (deviation) between the detection objective surface and the image plane formed through the liquid 50 by the projection optical system PL under the wet condition can be detected. The relationship between the surface of the substrate P and the image plane formed through the projection optical system PL and the liquid 50 is consequently detected by using the fiducial plate 42 by detecting the surface of the fiducial plate 42 under the wet condition.

Alignment and Exposure Under Wet Condition

When the measurement process as described above is completed, the control unit CONT moves the XY stage 52 to move the liquid immersion portion disposed under the projection optical system PL onto the substrate P while performing the supply and the recovery of the liquid 50 in order to expose each of the shot areas SH1 to SH20 on the substrate P. The surfaces of the fiducial plate 42, the auxiliary plate 41, and the substrate P have approximately the same height respectively. Therefore, the XY stage 52 can be moved in a state in which the liquid 50 is retained under the projection optical system PL.

The respective shot areas SH1 to SH20 on the substrate P are subjected the scanning exposure by using the respective pieces of information determined during the measurement process as described above (S8). That is, during the scanning exposure for each of the shot areas, each of the shot areas SH1 to SH20 on the substrate P and the mask M are subjected to the positional alignment on the basis of the information about the positional relationship between the fiducial mark PFM and each of the shot areas SH1 to SH20 determined before the supply of the liquid 50, and the projection position information about the image of the pattern on the mask M determined by using the fiducial mark MFM after the supply of the liquid 50 (S8).

During the scanning exposure for each of the shot areas SH1 to SH20, the positional relationship between the surface of the substrate P and the image plane formed through the liquid 50 is adjusted without using the focus/leveling-detecting system 14, on the basis of the information about the relationship between the surface of the fiducial plate 42 and the surface of the substrate P determined before the supply of the liquid 50, and the information about the positional relationship between the surface of the fiducial plate 42 and the image plane formed through the liquid 50 determined after the supply of the liquid 50. As described above, the detection with the focus/leveling-detecting system 14 performed through the liquid 50 is carried out only when the surface of the fiducial plate 42 is detected before the start of the exposure for the substrate P. Therefore, it is possible to perform the detecting operation of the focus/leveling-detecting system 14 by suppressing the influence of the temperature change of the liquid 50 or the like to be minimum.

The surface information about the surface of the substrate P may be detected by using the focus/leveling-detecting system 14 during the scanning exposure, which may be used to confirm the result of the adjustment of the positional relationship between the surface of the substrate P and the image plane. Alternatively, the surface information about the surface of the substrate P may be detected by using the focus/leveling-detecting system 14 during the scanning exposure, to which the surface information detected during the scanning exposure may be further added to adjust the positional relationship between the surface of the substrate P and the image plane.

In the embodiment described above, the focus/leveling-detecting system 14, which radiates the detecting light beam onto the inside or in the vicinity of the projection area to form the image of the pattern of the mask M therein, is used when the surface information about the substrate P is detected in the absence of liquid. However, it is also allowable to use another focus/leveling-detecting system (not shown) which is carried on the substrate alignment system 18. The focus/leveling-detecting system, which is carried on the substrate alignment system 18, is used to adjust the position of the surface of the substrate P when the alignment mark on the substrate P is detected by using the substrate alignment system 18. A specified arrangement of such a focus/leveling-detecting system is disclosed, for example, in Japanese Patent Application Laid-open No. 2001-257157 (corresponding to United States Patent Publication No. 2001/0023918A), the disclosure of which is incorporated herein by reference within a range of permission of the domestic laws and ordinances of the state designated or selected in this international application.

In the embodiment described above, the positional relationship between the surface of the substrate P and the image plane is adjusted by moving the Z stage 51 which holds the substrate P. However, the mask M and/or a part of the plurality of lenses for constructing the projection optical system PL may be moved to adjust the image plane to the surface of the substrate P. Alternatively, the wavelength of the exposure light beam EL may be finely adjusted.

In the embodiment described above, the supply of the liquid 50 from the liquid supply unit 1 is started after the detection of the fiducial mark PFM and the alignment mark on the substrate P. However, if possible, the liquid 50 may be supplied from the liquid supply unit 1 before the detection to detect the fiducial mark PFM and the alignment mark on the substrate P not through the liquid while locally retaining the liquid 50 on the side of the image plane of the projection optical system PL.

In the embodiment described above, the fiducial plate 42 is used to correlate the surface information about the substrate P measured under the dry condition with respect to the image plane formed through the projection optical system PL and the liquid 50. However, a predetermined area on the substrate P may be used as the fiducial surface in place of the fiducial plate 42, and the predetermined are is detected by using the focus/leveling-detecting system 14 under the dry condition and the wet condition to correlate the surface information about the substrate P measured under the dry condition with respect to the image plane formed through the projection optical system PL and the liquid 50.

In the embodiment described above, the focus/leveling-detecting system 14 is used for both of the dry condition and the wet condition. However, a focus/leveling-detecting system for the dry condition and a focus/leveling-detecting system for the wet condition may be provided separately.

When the relationship (offset) between the surface information about the substrate P detected under the dry condition by the focus/leveling-detecting system 14 and the image plane formed by the projection optical system PL through the liquid is previously known, then the detection under the wet condition by the focus/leveling-detecting system 14 may be omitted, and each of the shot areas on the substrate P may be subjected to the liquid immersion exposure while adjusting the positional relationship between the surface of the substrate P and the image plane formed by the projection optical system PL through the liquid on the basis of the surface information about the substrate P measured under the dry condition. In this procedure, it is also allowable that the fiducial plate 42 to serve as the fiducial surface is not provided on the substrate stage PST (provided that the fiducial mark is required).

As described above, the detection of the alignment mark on the substrate P and the detection of the surface information about the substrate P are performed not through the liquid 50 for the liquid immersion exposure, and then the liquid immersion exposure is performed on the basis of the obtained information. Therefore, it is possible to correctly perform the positional alignment between the mask M and each of the shot areas SH1 to SH20 on the substrate P and the adjustment of the positional relationship between the surface of the substrate P and the image plane formed through the liquid 50.

Figure 5:
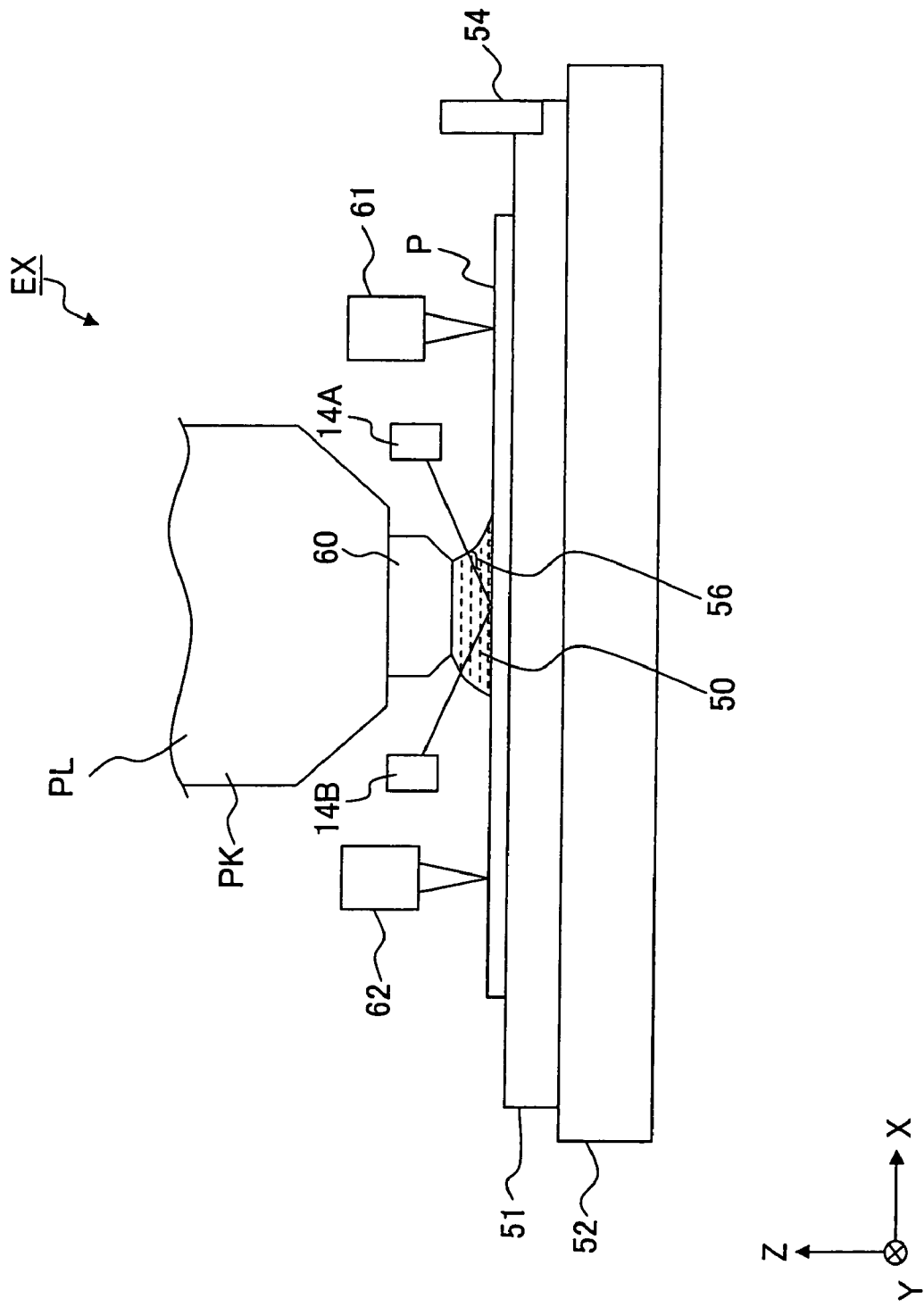
FIG. 5 shows a schematic arrangement illustrating another embodiment of the exposure apparatus of the present invention.

FIG. 5 shows a modified embodiment of the present invention, which illustrates a schematic arrangement in the vicinity of the lens 60 of the projection optical system PL. In FIG. 5, for the purpose of simplification, for example, the liquid supply unit 1, the liquid recovery unit 2, and the substrate alignment system 18 are omitted.

An exposure apparatus EX shown in FIG. 5 includes focus/leveling-detecting systems 61, 62 each of which has the same arrangement as that of the focus/leveling-detecting system 14 for detecting the surface information about the surface of the substrate P and which are provided on the both sides of the lens 60 of the projection optical system PL with respect to the X axis. The respective detection areas of the focus/leveling-detecting systems 61, 62 are set at positions separated from the liquid immersion portion even when the liquid is supplied under the projection optical system PL (the liquid 50 is locally retained on the side of the image plane of the projection optical system PL). The focus/leveling-detecting system 61 is used when the scanning exposure is performed while moving the substrate P in the −X direction, and the focus/leveling-detecting system 62 is used when the scanning exposure is performed while moving the substrate P in the +X direction.

In the case of the exposure apparatus of this embodiment, the positional alignment (alignment) for the mask M and each of the shot areas on the substrate P is performed in the same manner as in the embodiment described above.

In the measurement process in this embodiment, the surface position of the fiducial plate 42 is detected by using the focus/leveling-detecting system 14 in a state in which the liquid 50 is supplied to the space between the projection optical system PL and the fiducial plate 42, and the Z stage 51 is moved on the basis of the detection result so that the surface of the fiducial plate 42 is adjusted to match the image plane formed through the projection optical system PL and the liquid 50. In this situation, the respective detection areas of the focus/leveling-detecting systems 61, 62 are also positioned on the fiducial plate 42 (in this situation, the liquid is absent in the detection areas of the focus/leveling-detecting systems 61, 62). The surface of the fiducial plate 42 is detected by the focus/leveling-detecting systems 61, 62 respectively, and thus the control unit CONT can determine the relationship between the image plane formed through the projection optical system PL and the liquid 50 and the respective pieces of information detected by the focus/leveling-detecting systems 61, 62 not through the liquid.

When the measurement process is completed as described above, the control unit CONT moves the XY stage 52 while supplying and recovering the liquid 50 in order to expose each of the shot areas SH1 to SH20 on the substrate P so that the liquid immersion portion, which is disposed under the projection optical system PL, is moved onto the substrate P. The control unit CONT performs the scanning exposure for each of the shot areas SH1 to SH20 on the substrate P by using the respective pieces of information determined during the measurement process. During the scanning exposure for each of the shot areas on the substrate P, the positional relationship between the surface of the substrate P and the image plane formed through the projection optical system PL and the liquid 50 is adjusted by using the focus/leveling-detecting systems 61, 62 which have the detection areas disposed outside the liquid immersion portion between the projection optical system PL and the substrate P, without using the focus/leveling-detecting system 14. For example, when a certain shot area on the substrate P is subjected to the scanning exposure while moving the substrate P in the −X direction, the surface position information about the surface of the shot area is successively detected by the focus/leveling-detecting system 61 before the shot area as the exposure objective enters the liquid immersion portion between the projection optical system PL and the substrate P. Further, when the shot area passes through the liquid immersion portion between the projection optical system PL and the substrate P, the positional relationship between the shot area surface and the image plane is adjusted on the basis of the surface position information detected by the focus/leveling-detecting system 61. The relationship between the optimum image plane and the surface information detected by the focus/leveling-detecting system 61 is previously determined by using the fiducial plate 42. Therefore, the shot area surface can be correctly adjusted to match the optimum image plane without being affected, for example, by the temperature change of the liquid 50, even using only the surface position information detected by the focus/leveling-detecting system 61. It goes without saying that the focus/leveling-detecting system 14 is appropriately used in combination during the exposure, if necessary, as described in the previous embodiment.

In recent years, a twin-stage type exposure apparatus appears, which carries two stages for holding the substrates P. The present invention is also applicable to the twin-stage type exposure apparatus.

Figure 6:
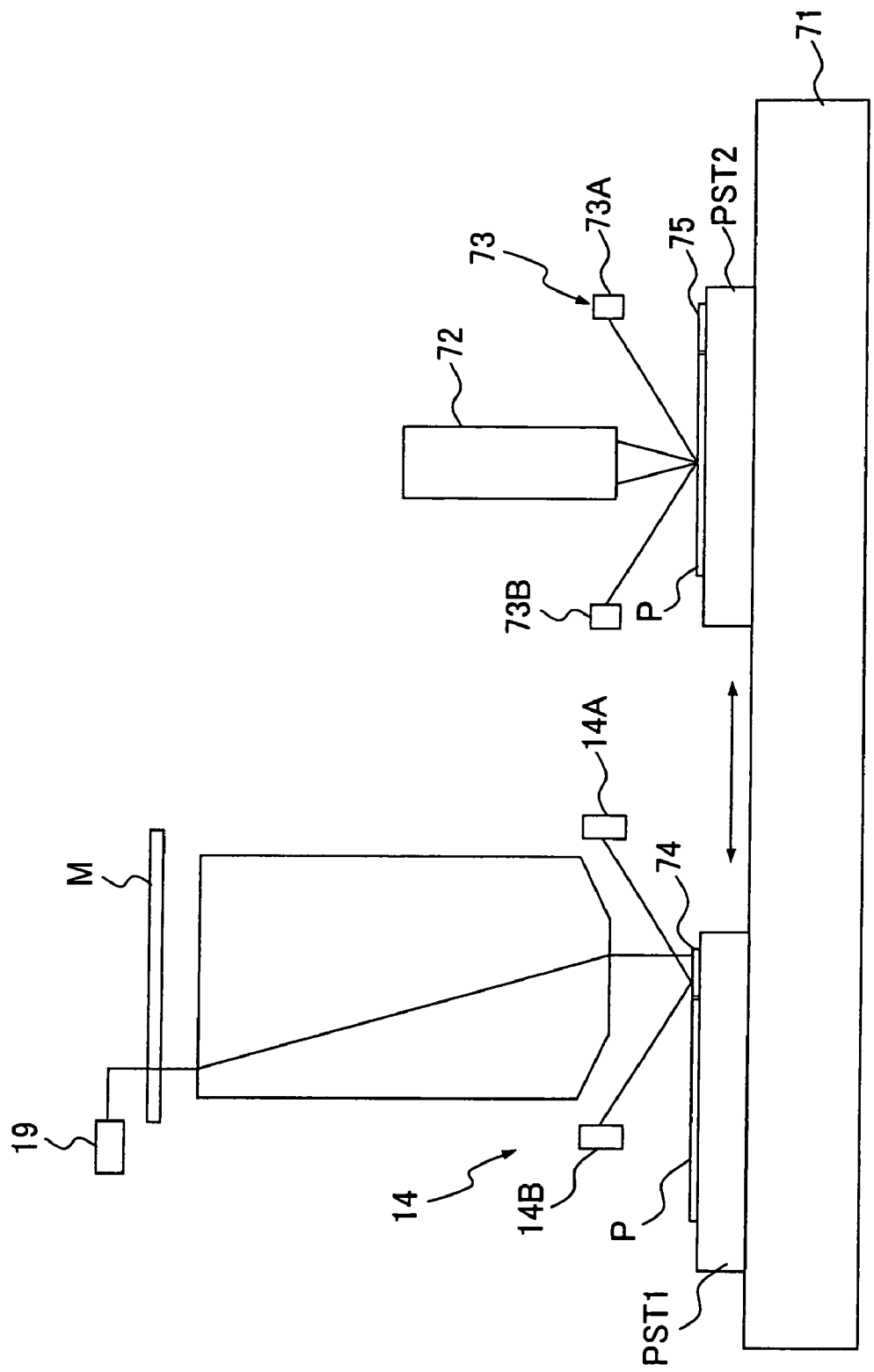
FIG. 6 shows a schematic arrangement illustrating still another embodiment of the exposure apparatus of the present invention.

FIG. 6 shows a schematic arrangement of the twin-stage type exposure apparatus. The twin-stage type exposure apparatus is provided with first and second substrate stages PST1, PST2 which are movable independently on a common base 71 respectively. The first and second substrate stages PST1, PST2 includes fiducial plates 74, 75 which are constructed equivalently to the fiducial plate 42 shown in FIG. 4 respectively. The twin-stage type exposure apparatus has an exposure station and a measurement/exchange station. All of the system shown in FIG. 4 (including the focus/leveling-detecting system 14) except for the substrate alignment system 18 is carried on the exposure station. The measurement/exchange station is provided with a substrate alignment system 72, and a focus/leveling-detecting system 73 including a light-emitting system 73A and a light-receiving system 73B.

The basic operation of the twin-stage type exposure apparatus as described above is as follows. For example, the exchange and the measurement process are performed for the substrate P on the first substrate stage PST1 on the measurement/exchange station, during the exposure process for the substrate P on the second substrate stage PST2 on the exposure station. When the respective operations are completed, the second substrate stage PST2 is moved to the measurement/exchange station, concurrently with which the first substrate stage PST1 is moved to the exposure station. In this situation, the measurement and the exchange process are performed on the second substrate stage PST2, and the exposure process is performed for the substrate P on the first substrate stage PST1.

When the present invention is applied to the twin-stage type exposure apparatus, the measurement process, which is performed not through the liquid as explained in the foregoing embodiment, is performed on the measurement/exchange station. For example, the liquid immersion exposure process is performed on the exposure station for the substrate P on the second substrate stage PST2, during which the measurement process is performed on the measurement station for the substrate P on the first substrate stage PST1 not through the liquid by using the substrate alignment system 72, the focus/leveling-detecting system 73, and the fiducial plate 74. When the measurement process, which is performed not through the liquid, is completed, the exchange operation is performed for the first substrate stage PST1 and the second substrate stage PST2. As shown in FIG. 6, the first substrate stage PST1 is positioned so that the fiducial plate 74 of the first substrate stage PST1 is opposed to the projection optical system PL. In this state, the control unit CONT starts the supply of the liquid 50 to fill the space between the projection optical system PL and the fiducial plate 74 with the liquid 50. The measurement process and the exposure process are performed through the liquid in the same manner as in the embodiment described above. The alignment information about each of the shot areas, which is once determined on the measurement/exchange station, is determined (stored) on the basis of the fiducial mark PFM of the fiducial plate. When the liquid immersion exposure is executed on the exposure station, the movement of the first substrate stage PST1 is controlled so that each of the shot areas is positioned on the basis of the positional relationship between the mask M and the fiducial mark MFM formed in the predetermined positional relationship with respect to the fiducial mark PFM of the fiducial plate. That is, the alignment information about each of the shot areas determined on the measurement/exchange station is effectively delivered to the exposure station by using the fiducial marks PFM, MFM.

As described above, in the case of the twin-stage type exposure apparatus, the measurement process can be performed not through the liquid on the other stage during the liquid immersion exposure process performed on one stage. Therefore, it is possible to improve the throughput of the exposure process. The structure and the exposure operation of the twin-stage type exposure apparatus are disclosed, for example, in Japanese Patent Application Laid-open Nos. 10-163099 and 10-214783 (corresponding to U.S. Pat. Nos. 6,341,007, 6,400,441, 6,549,269, and 6,590,634), Published Japanese Translation of PCT International Publication for Patent Application No. 2000-505958 (corresponding to U.S. Pat. No. 5,969,441), and U.S. Pat. No. 6,208,407, the disclosures of which are incorporated herein by reference within a range of permission of the domestic laws and ordinances of the state designated or selected in this international application.

The focus/leveling-detecting system 14 is arranged on the exposure station of the twin-stage type exposure apparatus described above. However, as disclosed in U.S. Pat. No. 6,208,407, the focus/leveling-detecting system of the exposure station may be omitted, and the positional relationship between the image plane of the projection optical system PL and the surface of the substrate P may be adjusted by using an interferometer for measuring the position information of the substrate stage PST in the Z direction. Of course, the interferometer for measuring the position information of the substrate stage PST in the Z direction and the focus/leveling-detecting system 14 may be used in combination.

In the embodiment described above, the fiducial mark MFM of the fiducial plate (for example, the fiducial plate 42) is detected by the mask alignment system 19 through the liquid 50. However, a transparent member (cover glass, correcting member) having a predetermined thickness may be arranged on the fiducial mark MFM, and the fiducial mark MFM may be detected by the mask alignment system 19 not through the liquid. In this procedure, a pseudo-liquid immersion state is formed between the projection optical system PL and the fiducial mark MFM by the transparent member. Therefore, it is possible to correctly measure the projection position information about the image of the pattern of the mask M by using the fiducial mark MFM even not through the liquid. Therefore, not only the alignment mark on the substrate P but also the fiducial mark MFM is detected not through the liquid. Therefore, it is possible to stably and correctly determine the alignment information in order to effect the positional alignment between the mask M and the substrate P.

The arrangement of the mask alignment system 19 is not limited to an arrangement as disclosed in Japanese Patent Application Laid-open No. 7-176468 (corresponding to U.S. Pat. No. 5,646,413). It is enough to detect the positional relationship between the mask M (mark of the mask M) and the fiducial or the reference (MFM) on the substrate stage PST.

In the embodiment described above, the liquid is supplied onto the substrate P after detecting the alignment mark on the substrate P without using the liquid. Therefore, for example, the deformation (expansion or shrinkage) of the substrate P and the deformation of the substrate stage PST are caused by the weight of the liquid and the temperature of the liquid. Even if the liquid immersion exposure is performed in this state on the basis of the position information about the alignment mark and the surface information about the substrate P detected under the dry condition, then the error such as the positional deviation or the defocus arises, and there is such a possibility that the pattern image of the mask M is not projected onto the substrate P in a desired state.

In such a case, the following procedure may be available. That is, any correction information (map information) is previously prepared in order to correct the deviation of the positional alignment caused by the supply of the liquid onto the substrate P, by using, for example, a technique as disclosed, for example, in Japanese Patent Application Laid-open No. 2002-353121 (United States Patent Publication No. 2002/0042664A) in relation to the positional alignment (alignment) between the pattern image and each of the shots on the substrate P. The correction information is added to the position information about the alignment mark of the substrate P detected under the dry condition to perform the positional alignment between the pattern image and each of the shot areas on the substrate P. Alternatively, any test exposure may be performed to determine similar correction information according to the amount of positional deviation of the pattern of each of the shots, and the positional alignment may be performed between the substrate P and each of the shot areas by using the correction information.

As for the focus/leveling control as well, the following procedure may be available. That is, for example, any test exposure is performed to previously determine the correction information in order to correct the error (defocus or the like) caused by the supply of the liquid onto the substrate P. The correction information is added to the surface information about the substrate P detected under the dry condition to adjust the positional relationship between the surface of the substrate P and the image plane formed through the liquid by the projection optical system PL.

As described above, pure water is used as the liquid 50 in this embodiment. Pure water is advantageous in that pure water is available in a large amount with ease, for example, in the semiconductor production factory, and pure water exerts no harmful influence, for example, on the optical element (lens) and the photoresist on the substrate P. Further, pure water exerts no harmful influence on the environment, and the content of impurity is extremely low. Therefore, it is also expected to obtain the function to wash the surface of the substrate P and the surface of the optical element provided at the tip surface of the projection optical system PL.

It is approved that the refractive index n of pure water (water) with respect to the exposure light beam EL having a wavelength of about 193 nm is approximately in an extent of 1.44 to 1.47. When the ArF excimer laser beam (wavelength: 193 nm) is used as the light source of the exposure light beam EL, then the wavelength is shortened on the substrate P by 1/n, i.e., to about 131 to 134 nm, and a high resolution is obtained. Further, the depth of focus is magnified about n times, i.e., about 1.44 to 1.47 times as compared with the value obtained in the air. Therefore, when it is enough to secure an approximately equivalent depth of focus as compared with the case of the use in the air, it is possible to further increase the numerical aperture of the projection optical system PL. Also in this viewpoint, the resolution is improved.

In the embodiment described above, the lens 60 is attached to the tip of the projection optical system PL. However, the optical element, which is attached to the tip of the projection optical system PL, may be an optical plate which is usable to adjust the optical characteristics of the projection optical system PL, for example, the aberration (for example, spherical aberration and comatic aberration). Alternatively, the optical element may be a parallel plane plate through which the exposure light beam EL is transmissive. When the optical element, which makes contact with the liquid 50, is the parallel plane plate which is cheaper than the lens, it is enough that the parallel plane plate is merely exchanged immediately before supplying the liquid 50 even when any substance (for example, any silicon-based organic matter), which deteriorates the transmittance of the projection optical system PL, the illuminance of the exposure light beam EL on the substrate P, and the uniformity of the illuminance distribution, is adhered to the parallel plane plate, for example, during the transport, the assembling, and/or the adjustment of the exposure apparatus EX. An advantage is obtained such that the exchange cost is lowered as compared with the case in which the optical element to make contact with the liquid 50 is the lens. That is, the surface of the optical element to make contact with the liquid 50 is dirtied, for example, due to the adhesion of scattered particles generated from the resist by being irradiated with the exposure light beam EL or any impurity contained in the liquid 50. Therefore, it is necessary to periodically exchange the optical element. However, when the optical element is the cheap parallel plane plate, then the cost of the exchange part is low as compared with the lens, and it is possible to shorten the time required for the exchange. Thus, it is possible to suppress the increase in the maintenance cost (running cost) and the decrease in the throughput.

When the pressure, which is generated by the flow of the liquid 50, is large between the substrate P and the optical element disposed at the tip of the projection optical system PL, it is also allowable that the optical element is tightly fixed so that the optical element is not moved by the pressure, rather than allowing the optical element to be exchangeable.

The liquid 50 is water in the embodiment described above. However, the liquid 50 may be any liquid other than water. For example, when the light source of the exposure light beam EL is the $F_2$ laser, the $F_2$ laser beam is not transmitted through water. Therefore, in this case, the liquid 50 may be, for example, fluorine-based oil (liquid) or perfluoropolyether (PFPE) through which the $F_2$ laser beam is transmissive. Alternatively, other than the above, it is also possible to use, as the liquid 50, those (for example, cedar oil) which have the transmittance with respect to the exposure light beam EL, which have the refractive index as high as possible, and which are stable against the photoresist applied to the surface of the substrate P and the projection optical system PL.

The substrate P, which is usable in the respective embodiments described above, is not limited to the semiconductor wafer for producing the semiconductor device. Those applicable include, for example, the glass substrate for the display device, the ceramic wafer for the thin film magnetic head, and the master plate (synthetic quartz, silicon wafer) for the mask or the reticle usable for the exposure apparatus.

In the embodiment described above, the exposure apparatus is adopted, in which the space between the projection optical system PL and the substrate P is locally filled with the liquid. However, the present invention is also applicable to a liquid immersion exposure apparatus in which a stage for holding a substrate as an exposure objective is moved in a liquid tank, and a liquid immersion exposure apparatus in which a liquid tank having a predetermined depth is formed on a stage and a substrate is held therein. The structure and the exposure operation of the liquid immersion exposure apparatus in which the stage for holding the substrate as the exposure objective is moved in the liquid tank are disclosed in detail, for example, in Japanese Patent Application Laid-open No. 6-124873. The structure and the exposure operation of the liquid immersion exposure apparatus in which the liquid tank having the predetermined depth is formed on the stage and the substrate is held therein are disclosed in detail, for example, in Japanese Patent Application Laid-open No. 10-303114 and U.S. Pat. No. 5,825,043. The disclosures of these documents are incorporated herein by reference within a range of permission of the domestic laws and ordinances of the state designated or selected in this international application.

As for the exposure apparatus EX, the present invention is also applicable to the scanning type exposure apparatus (scanning stepper) based on the step-and-scan system for performing the scanning exposure for the pattern of the mask M by synchronously moving the mask M and the substrate P as well as the projection exposure apparatus (stepper) based on the step-and-repeat system for performing the full field exposure for the pattern of the mask M in a state in which the mask M and the substrate P are stood still, while successively step-moving the substrate P. The present invention is also applicable to the exposure apparatus based on the step-and-stitch system in which at least two patterns are partially overlaid and transferred on the substrate P.

As for the type of the exposure apparatus EX, the present invention is not limited to the exposure apparatus for the semiconductor production apparatus for exposing the substrate P with the semiconductor device pattern. The present invention is also widely applicable, for example, to the exposure apparatus for producing the liquid crystal display device or for producing the display as well as the exposure apparatus for producing, for example, the thin film magnetic head, the image pickup device (CCD), the reticle, or the mask.

When the linear motor is used for the substrate stage PST and/or the mask stage MST, it is allowable to use any one of those of the air floating type based on the use of the air bearing and those of the magnetic floating type based on the use of the Lorentz's force or the reactance force. Each of the stages PST, MST may be either of the type in which the movement is effected along the guide or of the guideless type in which no guide is provided. An example of the use of the linear motor for the stage is disclosed in U.S. Pat. Nos. 5,623,853 and 5,528,118, the disclosures of which are incorporated herein by reference within a range of permission of the domestic laws and ordinances of the state designated or selected in this international application.

As for the driving mechanism for each of the stages PST, MST, it is also allowable to use a plane motor in which a magnet unit provided with two-dimensionally arranged magnets and an armature unit provided with two-dimensionally arranged coils are opposed to each other, and each of the stages PST, MST is driven by the electromagnetic force. In this arrangement, any one of the magnet unit and the armature unit is connected to the stage PST, MST, and the other of the magnet unit and the armature unit is provided on the side of the movable surface of the stage PST, MST.

The reaction force, which is generated in accordance with the movement of the substrate stage PST, may be mechanically released to the floor (ground) by using a frame member so that the reaction force is not transmitted to the projection optical system PL. The method for handling the reaction force is disclosed in detail, for example, in U.S. Pat. No. 5,528,118 (Japanese Patent Application Laid-open No. 8-166475), the disclosures of which are incorporated herein by reference within a range of permission of the domestic laws and ordinances of the state designated or selected in this international application.

The reaction force, which is generated in accordance with the movement of the mask stage MST, may be mechanically released to the floor (ground) by using a frame member so that the reaction force is not transmitted to the projection optical system PL. The method for handling the reaction force is disclosed in detail, for example, in U.S. Pat. No. 5,874,820 (Japanese Patent Application Laid-open No. 8-330224) The contents of the descriptions in the documents are incorporated herein by reference within a range of permission of the domestic laws and ordinances of the state designated or selected in this international application.

As described above, the exposure apparatus EX according to the embodiment of the present invention is produced by assembling the various subsystems including the respective constitutive elements as defined in claims so that the predetermined mechanical accuracy, the electric accuracy, and the optical accuracy are maintained. In order to secure the various accuracies, those performed before and after the assembling include the adjustment for achieving the optical accuracy for the various optical systems, the adjustment for achieving the mechanical accuracy for the various mechanical systems, and the adjustment for achieving the electric accuracy for the various electric systems. The steps of assembling the various subsystems into the exposure apparatus include, for example, the mechanical connection, the wiring connection of the electric circuits, and the piping connection of the air pressure circuits in correlation with the various subsystems. It goes without saying that the steps of assembling the respective individual subsystems are performed before performing the steps of assembling the various subsystems into the exposure apparatus. When the steps of assembling the various subsystems into the exposure apparatus are completed, the overall adjustment is performed to secure the various accuracies as the entire exposure apparatus. It is desirable that the exposure apparatus is produced in a clean room in which, for example, the temperature and the cleanness are managed.

Figure 7:
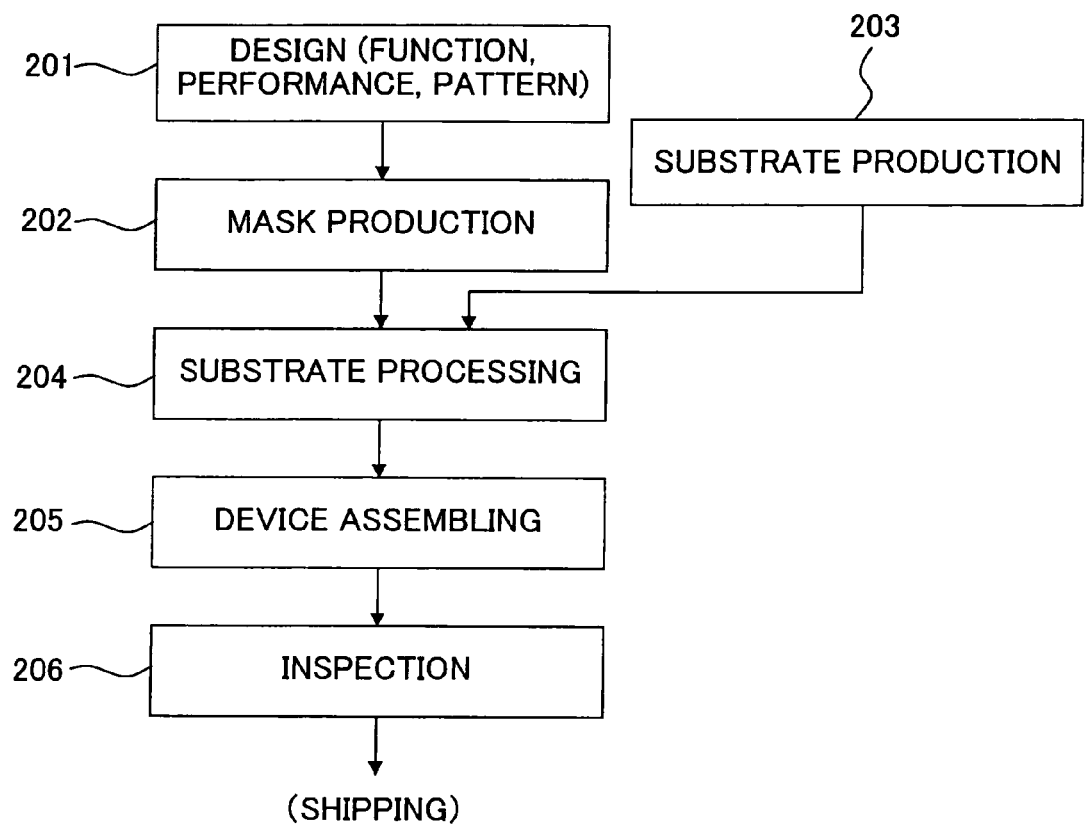
FIG. 7 shows a flow chart illustrating exemplary steps for producing a semiconductor device.

As shown in FIG. 7, the microdevice such as the semiconductor device is produced by performing, for example, a step 201 of designing the function and the performance of the microdevice, a step 202 of manufacturing a mask (reticle) based on the designing step, a step 203 of producing a substrate as a base material for the device, an exposure process step 204 of exposing the substrate with a pattern of the mask by using the exposure apparatus EX of the embodiment described above, a step of assembling the device (including a dicing step, a bonding step, and a packaging step) 205, and an inspection step 206.

According to the liquid immersion exposure apparatus and the liquid immersion exposure method of the present invention, the detection of the surface information about the substrate surface and the detection of the alignment mark on the substrate are performed not through the liquid for the liquid immersion exposure, and then the liquid immersion exposure is performed on the basis of the obtained information. Therefore, it is possible to correctly perform the adjustment of the positional relationship between the substrate surface and the image plane formed through the liquid and the positional alignment between each of the shot areas on the substrate and the projection position of the pattern image. Therefore, it is possible to perform the highly accurate exposure process, and it is possible to produce the device which exhibits the desired performance.

The invention claimed is:

1. An exposure apparatus comprising:
a projection optical system that projects a pattern onto an object to be exposed through a liquid;
a reference mark that serves as a reference for an alignment between the pattern and the object, the reference mark being provided separate from the object; and
an alignment system that aligns the object with the pattern based on alignment information obtained when the liquid is disposed in a space between the projection optical system and the reference mark, wherein
the reference mark is part of a member that is located adjacent to the object, the member being positioned relative to the object so that the liquid in the space between the projection optical system and the reference mark is retained in contact with the projection optical system when the member and the object are moved to position the object opposite to the projection optical system such that the liquid fills a gap between the projection optical system and the object.

2. An exposure apparatus according to claim 1, further comprising:
a stage on which the object is mounted; and
wherein the member includes a reference plate mounted on the stage, and the reference mark is provided on the reference plate.

3. An exposure apparatus according to claim 1, wherein the alignment system includes a light-receiving element for receiving light.

4. An exposure apparatus according to claim 1, wherein the alignment system includes an irradiating section for irradiating light.

5. A device manufacturing method comprising:
exposing an object using an exposure apparatus according to claim 1; and
processing the object that has been exposed.

6. An exposure apparatus comprising:
a projection optical system that projects a pattern onto an object to be exposed through a liquid;
a stage on which the object is mounted, the stage having a reference provided separate from the object;
a first alignment system by which an alignment mark of the object is detected; and
a second alignment system by which positional relation between the pattern and the reference is obtained by using the projection optical system when a space between the projection optical system and the reference is filled with the liquid, wherein
the reference is part of a member that is located adjacent to the object mounted on the stage, the member being positioned on the stage relative to the object mounted on the stage so that the liquid in the space between the projection optical system and the reference is retained in contact with the projection optical system when the stage is moved to position the object opposite to the projection optical system such that the liquid fills a gap between the projection optical system and the object.

7. The exposure apparatus according to claim 6, wherein based on information obtained by detecting the alignment mark of the object and the positional relation, the pattern and the object are aligned.

8. The apparatus according to claim 6, wherein positional relation between the alignment mark of the object and the reference is detected by using the first alignment system.

9. A device manufacturing method comprising:
exposing an object using an exposure apparatus according to claim 6; and
processing the object that has been exposed.

10. An exposure method that transfers an image of a pattern onto an object through a liquid using an exposure apparatus having a projection optical system and a reference mark that serves as a reference for an alignment between the pattern and the object, the reference mark being provided separate from the object, the method comprising:
projecting the pattern through the projection optical system and the liquid onto the object; and
aligning the object with the pattern based on alignment information obtained when the liquid is disposed in a space between the projection optical system and the reference mark, wherein
the reference mark is part of a member that is located adjacent to the object, the member being positioned relative to the object so that the liquid in the space between the projection optical system and the reference mark is retained in contact with the projection optical system when the member and the object are moved to position the object opposite to the projection optical system such that the liquid fills a gap between the projection optical system and the object.

11. The method according to claim 10, wherein the member has an edge that is sufficiently close to an edge of the object so that the liquid is retained in contact with the projection optical system when the object and the member are moved from a first state in which the reference mark is positioned opposite to the projection optical system to a second state in which the object is positioned opposite to the projection optical system.

12. The apparatus according to claim 1, wherein the member has an edge that is sufficiently close to an edge of the object so that the liquid is retained in contact with the projection optical system when the object and the member are moved from a first state in which the reference mark is positioned opposite to the projection optical system to a second state in which the object is positioned opposite to the projection optical system.

13. The apparatus according to claim 6, wherein the member has an edge that is sufficiently close to an edge of the object mounted on the stage so that the liquid is retained in contact with the projection optical system when the stage is moved from a first state in which the reference is positioned opposite to the projection optical system to a second state in which the object is positioned opposite to the projection optical system.

* * * * *